(12) United States Patent
Rober et al.

(10) Patent No.: US 10,673,102 B2
(45) Date of Patent: Jun. 2, 2020

(54) THREE-ELECTRODE DEVICE FOR PERFORMING ELECTROCHEMICAL ANALYSIS ON LITHIUM ION BATTERIES

(71) Applicant: GM GLOBAL TECHNOLOGY OPERATIONS LLC, Detroit, MI (US)

(72) Inventors: Kevin B. Rober, Washington, MI (US); Brian J. Koch, Berkley, MI (US); Robert S. Conell, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 346 days.

(21) Appl. No.: 15/885,318

(22) Filed: Jan. 31, 2018

(65) Prior Publication Data

US 2019/0237822 A1 Aug. 1, 2019

(51) Int. Cl.
*H01M 10/42* (2006.01)
*G01R 31/382* (2019.01)
*G01N 27/30* (2006.01)
*H01M 10/0525* (2010.01)

(52) U.S. Cl.
CPC ...... *H01M 10/4285* (2013.01); *G01N 27/301* (2013.01); *G01R 31/382* (2019.01); *H01M 10/0525* (2013.01)

(58) Field of Classification Search
CPC .......... H01M 2/26; H01M 2/266; H01M 4/13; H01M 10/42; H01M 10/4285; H01M 10/0525; H01M 2004/027; H01M 2004/028; G01N 27/30; G01N 27/301; G01N 27/333; G01R 31/36; G01R 31/364; G01R 31/38; G01R 31/382
See application file for complete search history.

(56) References Cited

U.S. PATENT DOCUMENTS

| | | | | |
|---|---|---|---|---|
| 8,163,410 | B2* | 4/2012 | Fulop | H02J 7/0045 429/61 |
| 2009/0027070 | A1* | 1/2009 | Gelling | G01N 17/02 324/693 |
| 2016/0079629 | A1* | 3/2016 | Abe | H01M 10/052 429/331 |

OTHER PUBLICATIONS

Brian J. Koch et al.; U.S. Appl. No. 15/252,539, filed Aug. 31, 2016 entitled "Reference Electrode"; 38 pages.

\* cited by examiner

*Primary Examiner* — Son T Le
(74) *Attorney, Agent, or Firm* — Harness, Dickey & Pierce, P.L.C.

(57) ABSTRACT

A device for performing electrochemical analysis of electrochemical cells includes a housing, upper and lower stack holders, and first, second, and third current collectors. The housing includes an inner chamber that can be hermetically sealed and a central axis extending through the inner chamber. The upper and lower stack holders are disposed within the inner chamber and cooperate to define an electrode stack chamber for housing a negative electrode, a positive electrode, and a center-mounted reference electrode. The first, second, and third current collectors are at least partially disposed in the inner chamber. The first current collector can be electrically connected to a first side of the negative electrode and an external circuit. The second current collector can be in electrical contact with the positive electrode and the external circuit. The third cylindrical body can be in electrical contact with the center-mounted reference electrode and the external circuit.

20 Claims, 8 Drawing Sheets

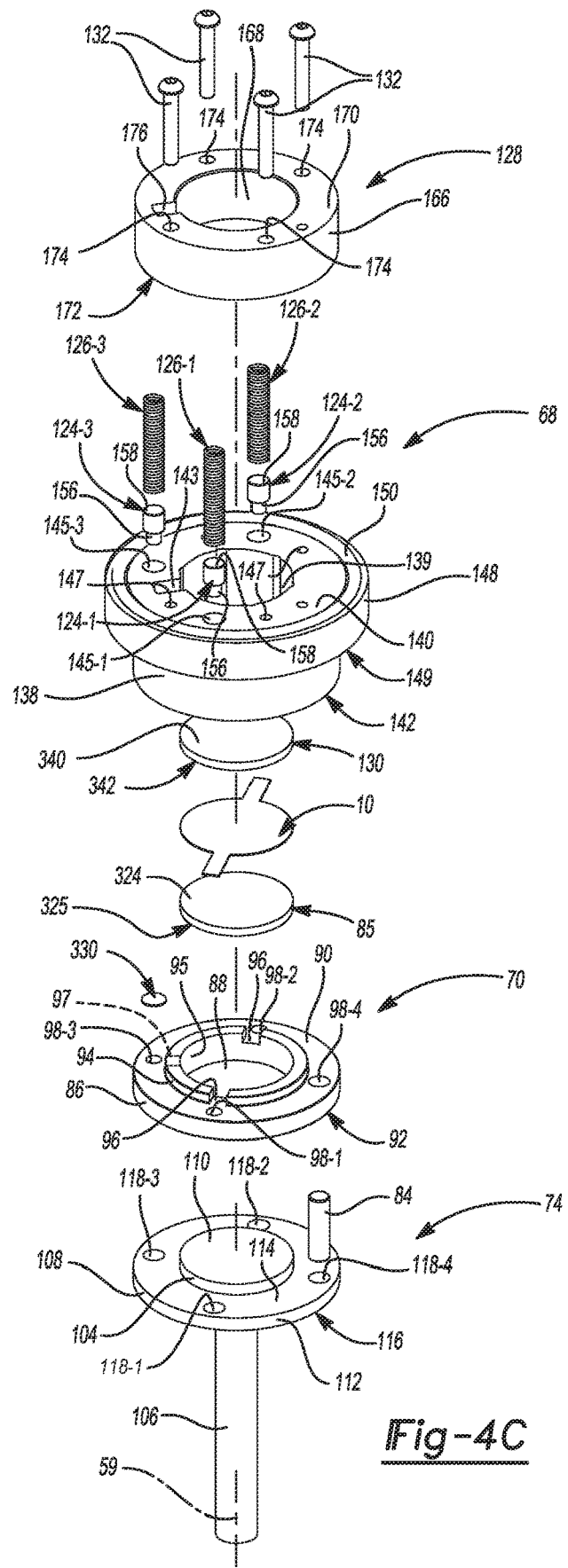

THREE-ELECTRODE DEVICE FOR PERFORMING ELECTROCHEMICAL ANALYSIS ON LITHIUM ION BATTERIES

INTRODUCTION

The present disclosure relates to a three-electrode device, and more particularly, to a three-electrode device for performing electrochemical analysis on lithium ion batteries.

This section provides background information related to the present disclosure which is not necessarily prior art.

By way of background, high-energy density, electrochemical cells, such as lithium-ion batteries can be used in a variety of consumer products and vehicles, such as Hybrid Electric Vehicles (HEVs) and Electric Vehicles (EVs). Typical lithium-ion, lithium sulfur, and lithium-lithium symmetrical batteries include a first electrode, a second electrode, an electrolyte material, and a separator. One electrode serves as a positive electrode or cathode and another serves as a negative electrode or anode. A stack of battery cells may be electrically connected to increase overall output.

Rechargeable lithium-ion batteries operate by reversibly passing lithium-ions back and forth between the negative electrode and the positive electrode. A separator and an electrolyte are disposed between the negative and positive electrodes. The electrolyte is suitable for conducting lithium-ions and may be in solid (e.g., solid state diffusion) or liquid form. Lithium-ions move from a cathode (positive electrode) to an anode (negative electrode) during charging of the battery, and in the opposite direction when discharging the battery. It may be desirable to perform electrochemical analysis on batteries or certain components of batteries, such as the cathode and the anode.

SUMMARY

This section provides a general summary of the disclosure, and is not a comprehensive disclosure of its full scope or all of its features.

The present disclosure provides in certain aspects, a device for performing electrochemical analysis of electrochemical cells. The device includes a housing, a first current collector, an upper stack holder, a lower stack holder, a second current collector, and a third current collector. The housing includes a first non-electrically-conductive material. The housing further includes an inner chamber that can be hermetically sealed and a central axis extending through the inner chamber. The first current collector is at least partially disposed within the inner chamber. The first current collector includes a first electrically-conductive material. The first current collector includes a first cylindrical body that extends along the central axis. The first cylindrical body can be in electrical contact with a first side of a negative electrode and an external circuit. The upper stack holder is disposed within the inner chamber. The upper stack holder includes an upper annular body including a second non-electrically-conductive material. The upper stack holder includes an upper centrally-disposed opening. The central axis extends through the upper centrally-disposed opening. The upper annular body of the upper stack holder is disposed around at least a portion of a peripheral surface of the first cylindrical body of the first current collector. The lower stack holder is disposed within the inner chamber. The lower stack holder includes a lower annular body including a third non-electrically-conductive material. The lower annular body includes a lower centrally-disposed opening. The central axis extends through the lower centrally-disposed opening. The lower stack holder defines a first stack aperture extending substantially parallel to the central axis. The lower centrally-disposed opening of the lower stack holder cooperates with the upper centrally-disposed opening of the upper stack holder to define an electrode stack chamber. The electrode stack chamber can house the negative electrode, a positive electrode, and a center-mounted reference electrode. The second current collector is at least partially disposed within the lower centrally-disposed opening of the lower stack holder. The second current collector includes a second electrically-conductive material. The second current collector includes a second cylindrical body. The second cylindrical body extends along the central axis. The second cylindrical body can be in electrical contact with the positive electrode and the external circuit. The third current collector includes a third electrically-conductive material. The third current collector has a third cylindrical body. The third cylindrical body is at least partially disposed in the first stack aperture. The third cylindrical body can be in electrical contact with the center-mounted reference electrode and the external circuit.

In one aspect, the device also includes a fourth current collector and a fifth current collector. The fourth current collector includes a fourth electrically-conductive material. The fourth current collector includes a fourth cylindrical body. The fourth cylindrical body is at least partially disposed in a second stack aperture of the lower annular body of the lower stack holder. The second stack aperture extends substantially parallel to the central axis. The fourth current collector can be in electrical contact with a second side of the negative electrode opposite the first side of the negative electrode and the external circuit. The fifth current collector includes a fifth electrically-conductive material. The fifth current collector includes a fifth cylindrical body. The fifth cylindrical body is at least partially disposed in a third stack aperture of the lower annular body of the lower stack holder. The third stack aperture extends substantially parallel to the central axis. The fifth current collector can be in electrical contact with an auxiliary electrode disposed adjacent to the third stack aperture and between the upper stack holder and the lower stack holder.

In one aspect, the device also includes a plurality of pins, and a plurality of compression springs. The plurality of pins includes a first pin, a second pin, and a third pin. Each of the first pin, the second pin, and the third pin includes a head and a shaft. The plurality of compression springs includes a first compression spring, a second compression spring, and a third compression spring. The upper annular body of the upper stack holder includes a first upper stack surface and a second upper stack surface opposite the first upper stack surface. The upper annular body defines a plurality of counterbores. The counterbores extend between the first upper stack surface and the second upper stack surface. The counterbores extend substantially parallel to the central axis. The plurality of counterbores includes a first counterbore, a second counterbore, and a third counterbore. The first counterbore, the second counterbore, and the third counterbore are axially-aligned with the first stack aperture, the second stack aperture, and the third stack aperture, respectively. The first pin, the second pin, and the third pin are at least partially disposed in the first counterbore, the second counterbore, and the third counterbore, respectively. The shaft of the first pin can engage the third current collector. The shaft of the second pin can engage the fourth current collector. The shaft of the third pin can engage the fifth current collector. The plurality of compression springs engage the respective heads of the plurality of pins to maintain engagement of the first pin, the second pin, and the third pin with the third current collector, the fourth current collector, and the fifth current collector, respectively.

In one aspect, the device further includes a spring-retaining cap. The spring-retaining cap includes a cap annular body. The cap annular body engages the first upper stack surface to retain the first compression spring, the second compression spring, and the third compression spring in the first counterbore, the second counterbore, and the third counterbore, respectively.

In one aspect, the spring-retaining cap includes a fourth non-electrically-conductive material.

In one aspect, the lower annular body of the lower stack holder includes a first lower stack surface, a second lower stack surface opposite the first lower stack surface, and an annular projection. The first stack surface engages the upper stack holder. The annular projection extends from the first lower stack surface. The annular projection is disposed adjacent to the lower centrally-disposed opening of the lower stack holder. The first stack aperture, the second stack aperture, and the third stack aperture are each disposed radially outward of the annular projection.

In one aspect, the second cylindrical body of the second current collector includes a stage and a flange. The state is at least partially disposed within the lower centrally-disposed opening of the lower stack holder. The flange projects radially-outward from the stage. The second cylindrical body includes a first body surface that can engage the positive electrode and a second body surface opposite the first body surface. The second current collector further includes a stem. The stem extends from the second body surface. The stem is substantially aligned with the central axis. The stem is at least partially disposed outside of the inner chamber for connecting to the external circuit. The flange defines a first flange aperture, a second flange aperture, and a third flange aperture. The first flange aperture is substantially axially-aligned with the first stack aperture of the lower stack holder. The second flange aperture is substantially axially-aligned with the second stack aperture of the lower stack holder. The third flange aperture is substantially axially-aligned with the third stack aperture of the lower stack holder. The third current collector is at least partially disposed in the first flange aperture. The fourth current collector is at least partially disposed in the second flange aperture. The fifth current collector is at least partially disposed in the third flange aperture.

In one aspect, the upper annular body of the upper stack holder includes a first upper stack surface and a second upper stack surface opposite the first upper stack surface. The second upper stack surface engages the first lower stack surface. The second upper stack surface defines a blind hole. The lower stack holder further defines a fourth stack aperture. The fourth stack aperture is disposed radially-outward of the annular projection. The fourth stack aperture extends substantially parallel to the central axis. The flange of the second current collector further defines a fourth flange aperture. The fourth flange aperture is substantially axially-aligned with the fourth stack aperture. The axial pin extends through the fourth flange aperture, the fourth stack aperture, and the blind hole.

In one aspect, the fourth electrically-conductive material includes copper. The fifth electrically-conductive material includes copper.

In one aspect, the third current collector includes a first wire. The first wire is partially disposed outside of the inner chamber for connection to the external circuit. The fourth current collector includes a second wire. The second wire is partially disposed outside of the inner chamber for connection to the external circuit. The fifth current collector includes a third wire partially disposed outside of the inner chamber for connection to the external circuit.

In one aspect, the device further includes a central compression spring. The first cylindrical body of the first current collector includes a first surface and a second surface opposite the first surface. The first surface defines a cylindrical depression. The cylindrical depression is centered with respect to the central axis. The second surface can engage the first side of the negative electrode. The first current collector further includes a stem. The stem extends from a depression surface of the cylindrical depression. The stem is at least partially disposed outside of the inner chamber for connection to the external circuit. The central compression spring is disposed around the stem. The central compression spring can compress and engage the housing and the first current collector to maintain engagement of first current collector with the negative electrode.

In one aspect, the device further includes a radial pin. The radial pin is at least partially disposed in a blind hole defined in a peripheral surface of the first cylindrical body of the first current collector. The radial pin extends radially outward from the peripheral surface of the first cylindrical body. The radial pin can engage the upper stack holder to prevent rotation of the first current collector with respect to the upper stack holder.

In one aspect, the device further includes a first conductive disc and a second conductive disc. The first conductive disc includes the second electrically-conductive material. The first conductive disc can be disposed between and electrically connected to the positive electrode and the second current collector. The first conductive disc is at least partially disposed within the lower centrally-disposed opening. The second conductive disc includes the first electrically-conductive material. The second conductive disc can be disposed between and electrically connected to the first current collector and the negative electrode. The second conductive disc is at least partially disposed within the upper centrally-disposed opening.

In one aspect, the first electrically-conductive material includes copper. The second electrically-conductive material includes aluminum.

In one aspect, the third electrically-conductive material includes glassy carbon.

In one aspect, the third current collector includes a wire including the glassy carbon. The wire is at least partially disposed within a tube including brass.

In one aspect, the housing includes a base and a cap. The base includes a base cylindrical body. The base cylindrical body defines a first cavity. The base cylindrical body includes a first plurality of threads. The cap includes a cap cylindrical body. The cap cylindrical body defines a second cavity. The cap cylindrical body includes a second plurality of threads. The second plurality of threads engages the first plurality of threads to fix the cap to the base. The first cavity and the second cavity cooperate to define the inner chamber of the housing.

The present disclosure provides in other aspects a device for performing electrochemical analysis of electrochemical cells. The device includes a housing, a first current collector, an upper stack holder, a lower stack holder, a reference electrode assembly, an auxiliary electrode, a second current collector, a third current collector, a fourth current collector, and a fifth current collector. The housing includes a non-electrically-conductive material. The housing has an inner chamber. The inner chamber can be hermetically sealed. A central axis extends through the inner chamber. The first current collector is at least partially disposed within the inner chamber. The first current collector includes a first electrically-conductive material. The first current collector includes a first cylindrical body. The first cylindrical body extends along the central axis. The first cylindrical body is in electrical contact with a first negative electrode side of a negative electrode and an external circuit. The upper stack holder is disposed within the inner chamber. The upper stack holder has an upper annular body including the non-electrically-conductive material. The upper annular body includes an upper centrally-disposed opening. The central axis extends through the upper centrally-disposed opening. The upper annular body of the upper stack holder is disposed around at least a portion of a peripheral surface of the first cylindrical body of the first current collector. The lower stack holder is disposed within the inner chamber. The lower stack holder has a lower annular body including the non-electrically-conductive material. The lower annular body includes a lower centrally-disposed opening. The central axis extends through the lower centrally-disposed opening. The lower stack holder defines a plurality of stack apertures extending substantially parallel to the central axis, wherein the plurality of stack apertures includes a first stack aperture, a second stack aperture, and a third stack aperture. The lower centrally-disposed opening of the lower stack holder cooperates with the upper centrally-disposed opening of the upper stack holder to define an electrode stack chamber. The reference electrode assembly includes a separator, a conductive negative electrode contact, a reference electrode, and a reference electrode connector. The separator includes a first separator surface and a second separator surface opposite the first separator surface. The conductive negative electrode contact is disposed on the first separator surface. The conductive negative electrode contact engages the lower stack holder. The conductive negative electrode contact extends over an end of the second stack aperture. The reference electrode is disposed on the second separator surface. The reference electrode is centered with respect to the central axis. The reference electrode connector is disposed on the second separator surface. The reference electrode connector is electrically connected to the reference electrode. The reference electrode connector engages the lower stack holder. The reference electrode connector extends over an end of the third stack aperture. The reference electrode assembly can be disposed between a negative electrode and a positive electrode within the electrode stack chamber. The auxiliary electrode is disposed between the upper stack holder and the lower stack holder. The auxiliary electrode extends over the stack third aperture. The auxiliary electrode is disposed radially outward of reference electrode assembly. The second current collector is at least partially disposed within the lower centrally-disposed opening of the lower stack holder. The second current collector includes a second electrically-conductive material. The second current collector includes a second cylindrical body. The second cylindrical body extends along the central axis. The second cylindrical body can be in electrical contact with the positive electrode and the external circuit. The third current collector includes a third electrically-conductive material. The third current collector has a third cylindrical body. The third cylindrical body is at least partially disposed in the first stack aperture. The third cylindrical body is in electrical contact with the reference electrode and the external circuit. The fourth current collector includes a fourth electrically-conductive material. The fourth current collector has a fourth cylindrical body. The fourth cylindrical body is at least partially disposed in the second stack aperture. The fourth current collector can be in electrical contact with the second negative electrode side and the external circuit. The fifth current collector includes a fifth electrically-conductive material. The fifth current collector has a fifth cylindrical body. The fifth cylindrical body is at least partially disposed in the third stack aperture. The fifth current collector is in electrical contact with the auxiliary electrode and the external circuit.

In one aspect, the device also includes a plurality of pins, and a plurality of compression springs. The plurality of pins includes a first pin, a second pin, and a third pin. Each of the first pin, the second pin, and the third pin includes a head and a shaft. The plurality of compression springs includes a first compression spring, a second compression spring, and a third compression spring. The upper annular body of the upper stack holder includes a first upper stack surface and a second upper stack surface opposite the first upper stack surface. The upper annular body defines a plurality of counterbores extending between the first upper stack surface and the second upper stack surface. The counterbores extend substantially parallel to the central axis. The plurality of counterbores includes a first counterbore, a second counterbore, and a third counterbore. The first counterbore, the second counterbore, and the third counterbore are axially-aligned with the first stack aperture, the second stack aperture, and the third stack aperture, respectively. The first pin, the second pin, and the third pin are at least partially disposed in the first counterbore, the second counterbore, and the third counterbore, respectively. The shaft of the first pin is can engage the third current collector, the shaft of the second pin can engage the fourth current collector, and the shaft of the third pin is can engage the fifth current collector. The plurality of compression springs engage the respective heads of the plurality of pins to maintain engagement of the first pin, the second pin, and the third pin with the third current collector, the fourth current collector, and the fifth current collector, respectively.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 1:
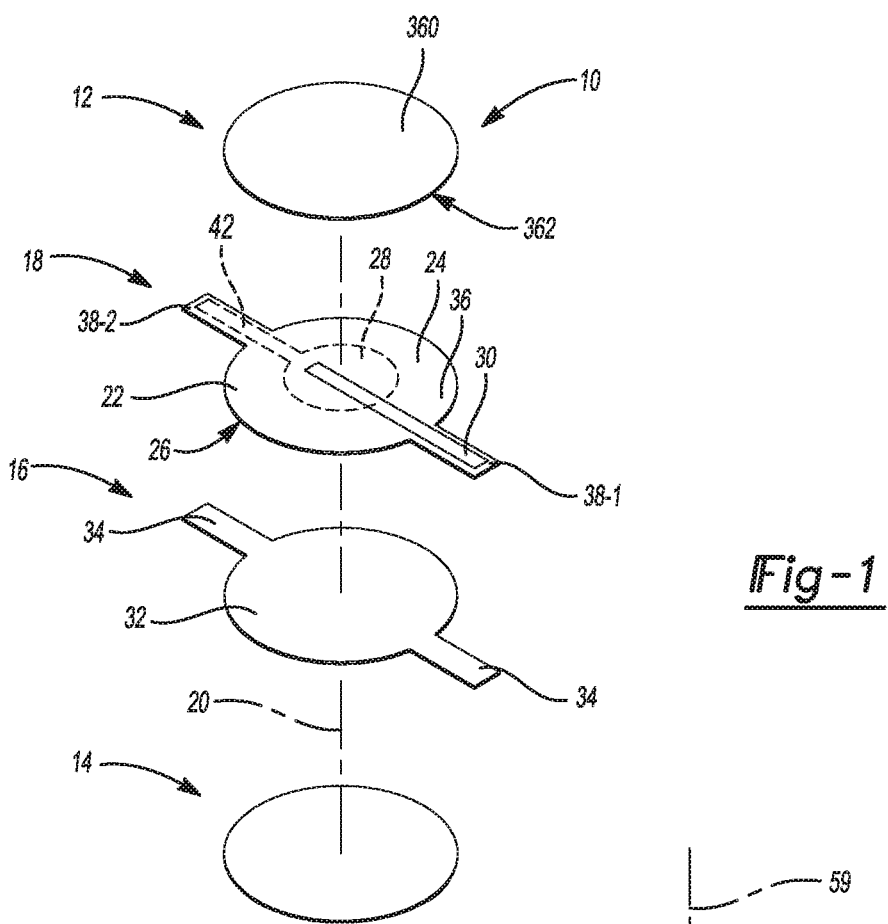
FIG. 1 is an exploded view of an electrode stack including a center-mounted reference electrode according to certain aspects of the present disclosure.
Figure 2:
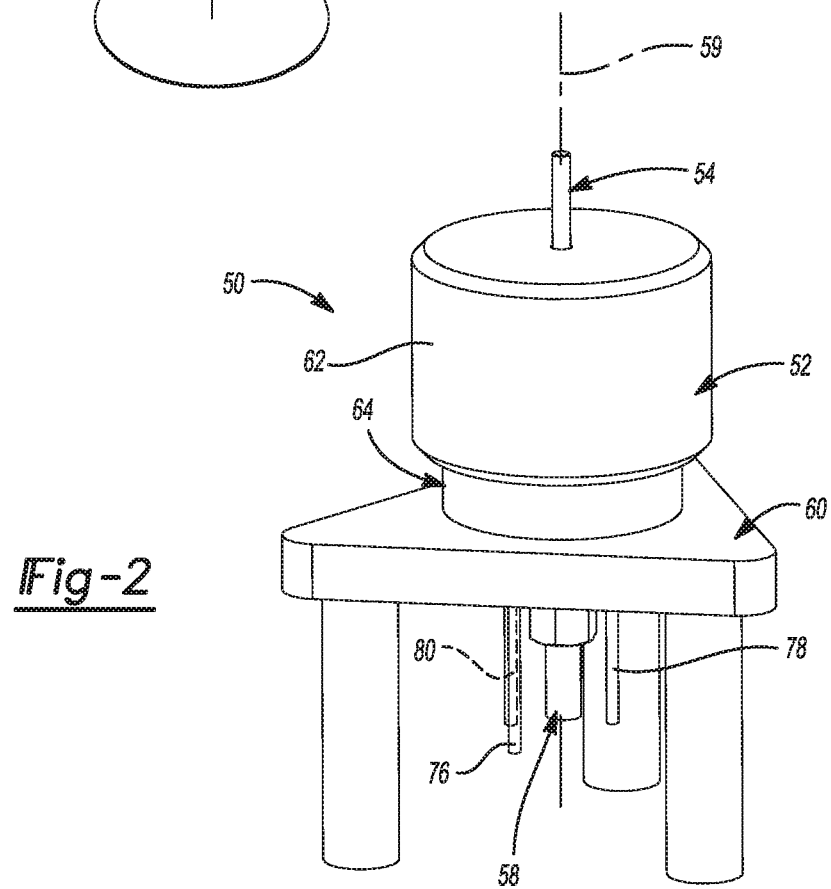
FIG. 2 is a perspective view of a three-electrode device for performing electrochemical analysis on the electrode stack of FIG. 1 according to certain aspects of the present disclosure, the three-electrode device being in an assembled state.
Figure 4A:
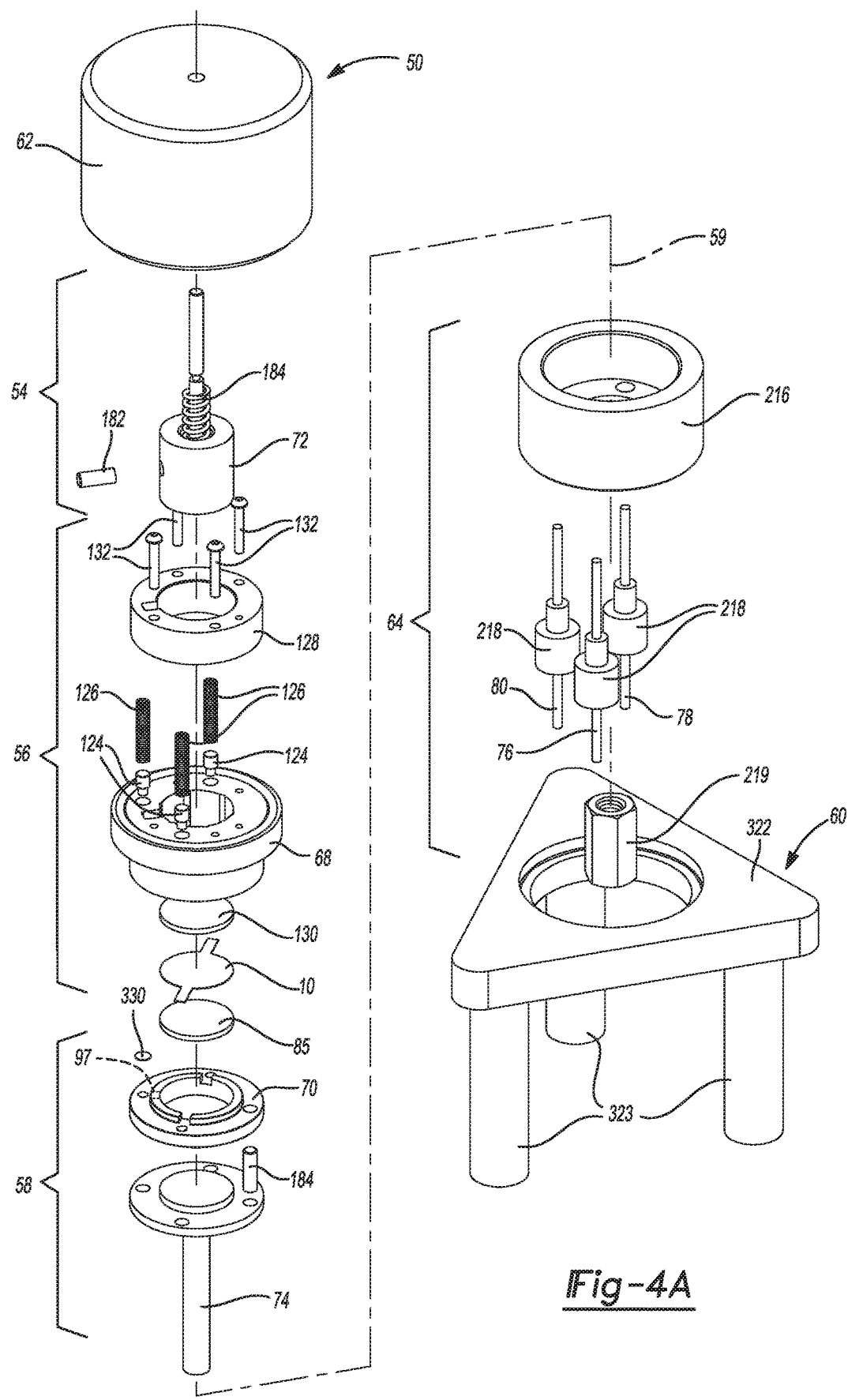
Figure 4B:
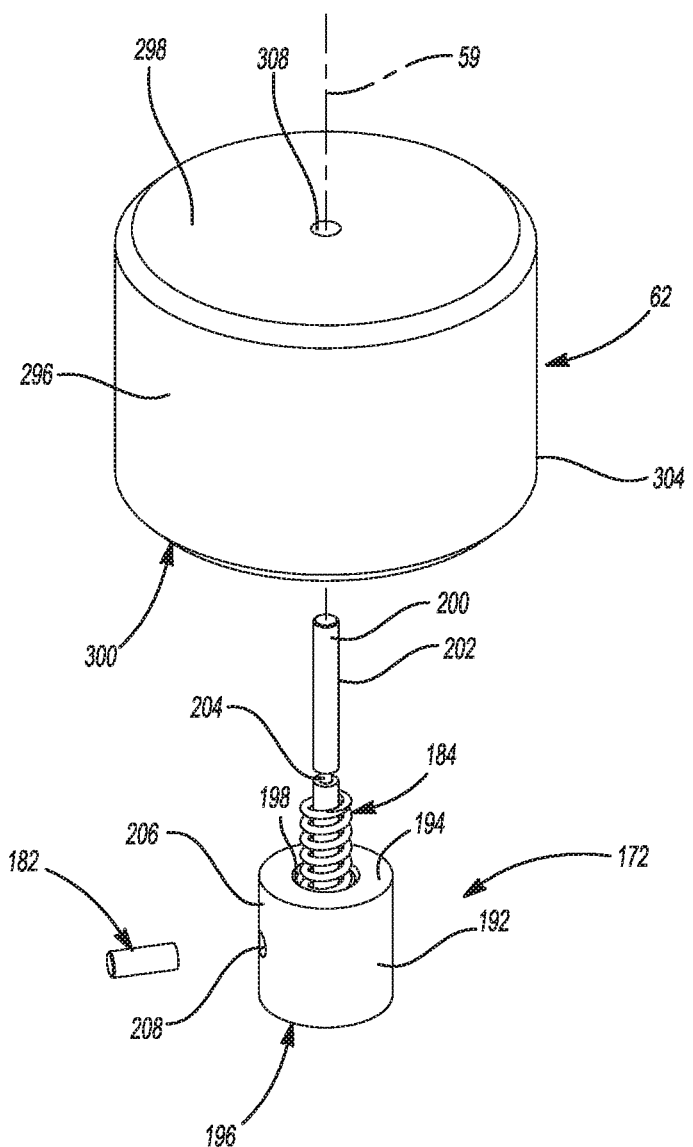
Figure 4D:
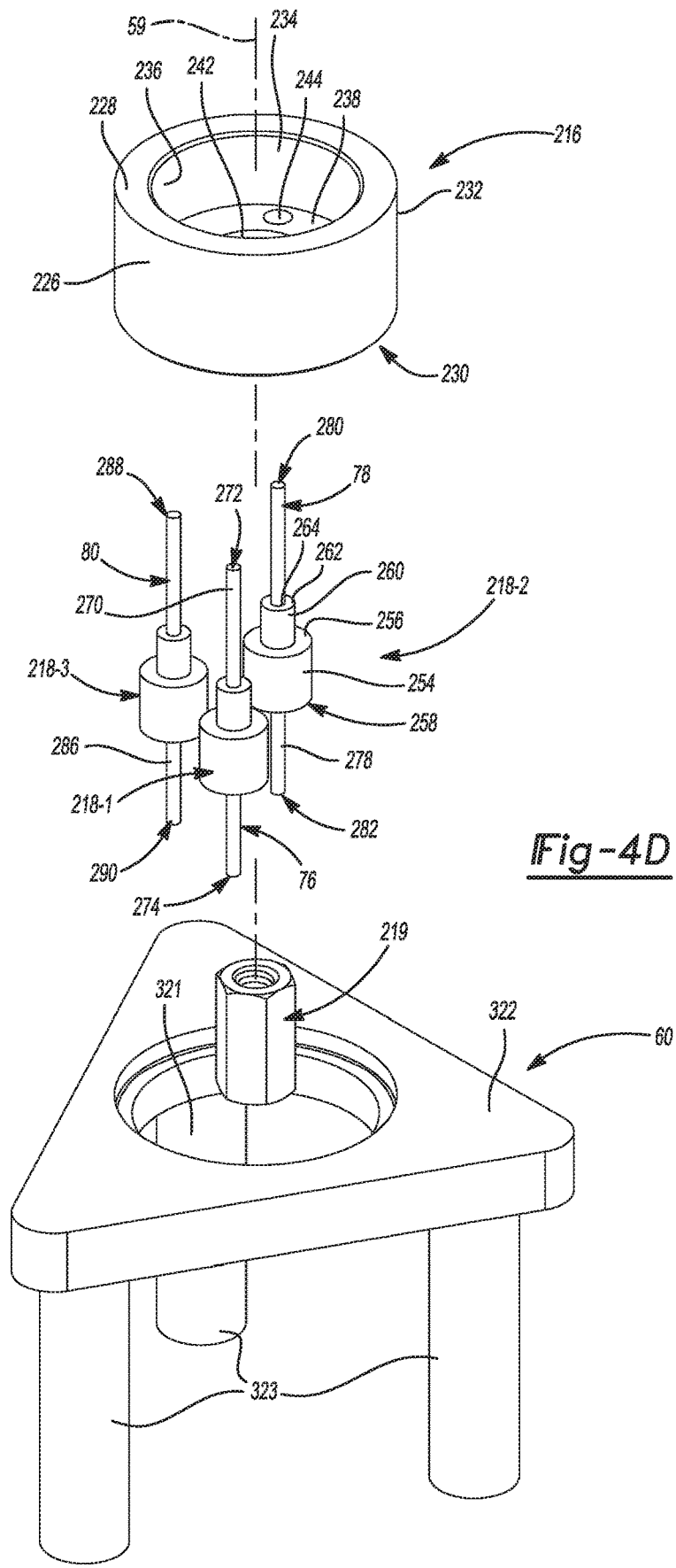
Figure 5A:
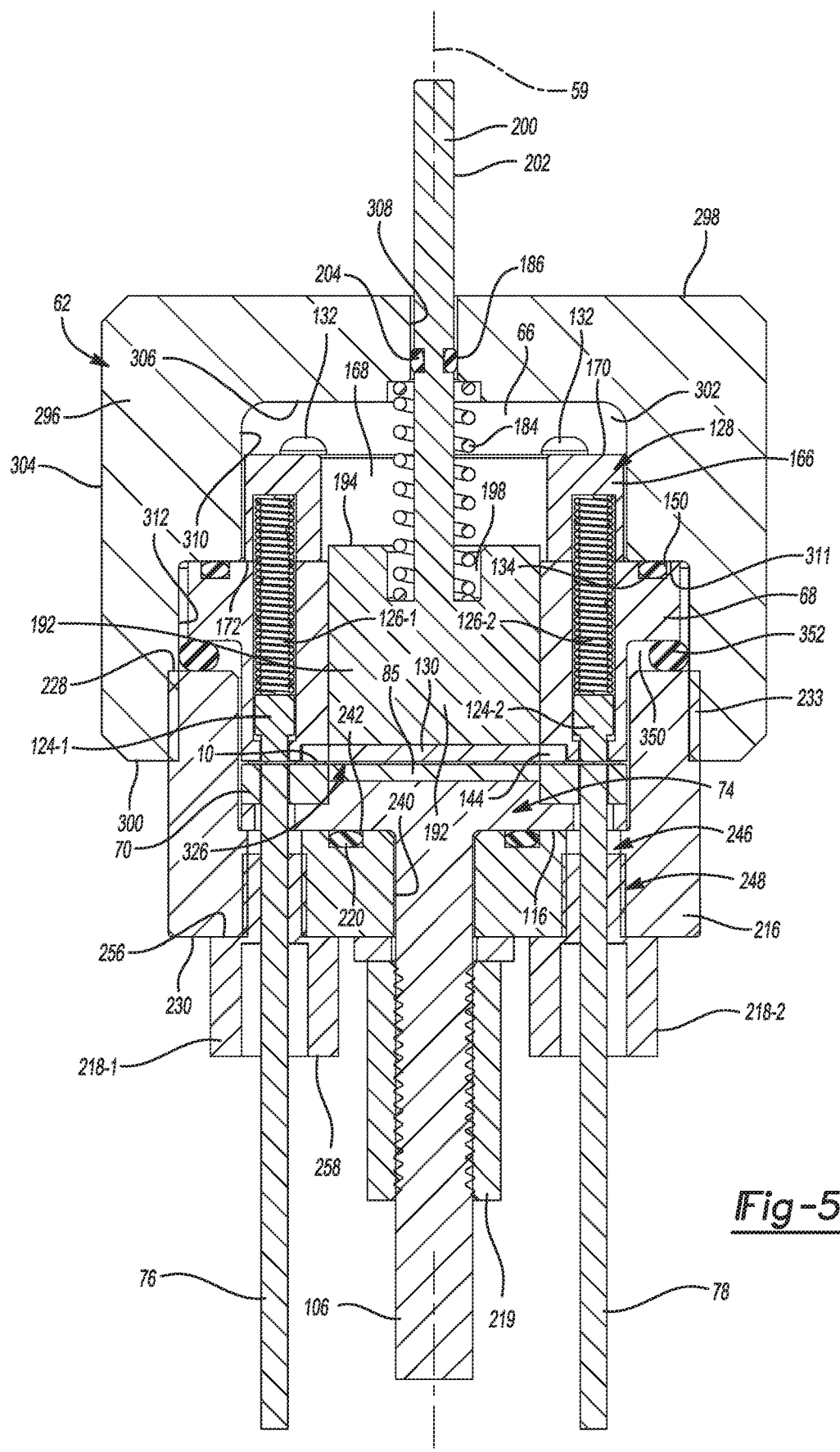
Figure 5B:
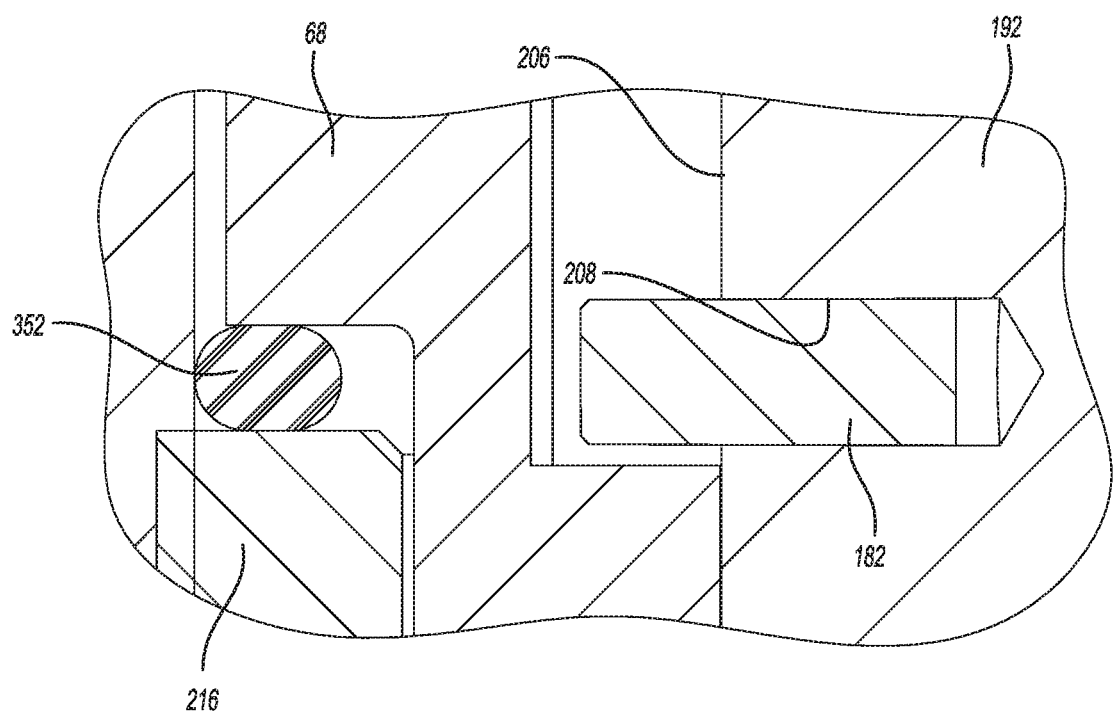
Figure 5C:
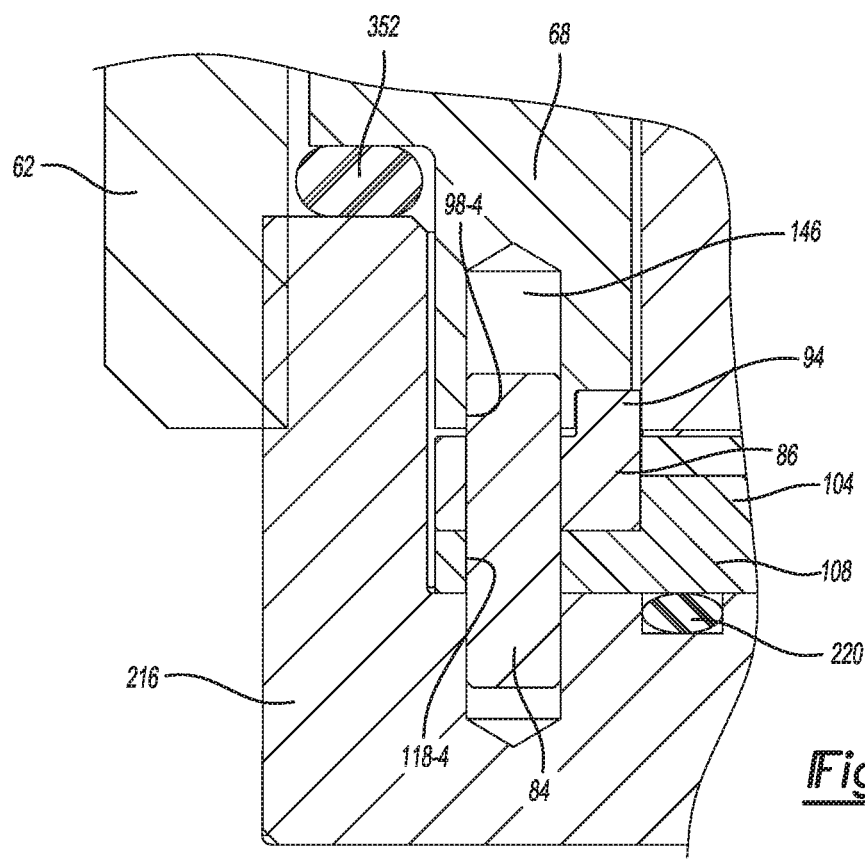

FIGS. 4A-4D are exploded views of the three-electrode device of FIG. 2. FIG. 4A shows the three-electrode device; FIG. 4B shows an upper enclosure and a first current collector assembly; FIG. 4C shows an internal assembly, the electrode stack of FIG. 1, an auxiliary electrode, and a second current collector assembly; and FIG. 4D shows a lower enclosure and a stand; and FIGS. 5A-5C are cross-sectional views of the three-electrode device of FIG. 2. FIG. 5A shows the three-electrode device; FIG. 5B shows a pin fixing the first current collector to the upper stack holder; and FIG. 5C shows another pin fixing the second current collector, the lower stack holder, and the upper stack holder to one another.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of" the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

It may be desirable to perform electrochemical analysis on anodes and cathodes, such as commercial anodes and cathodes. Electrochemical analysis may produce calibrations for control systems in HEVs and EVs pertaining to fast charge, lithium plating, state of charge, and power estimation. The anode and cathode may be analyzed by assembling an electrochemical cell including the anode, the cathode, and a reference electrode. The reference electrode enables monitoring of individual anode and cathode potentials as the cell is being cycled. It may be desirable to measure individual potentials at respective centers of the anode and the cathode.

Existing reference electrodes may be side-mounted. That is, the reference electrode is disposed along a periphery of an electrode stack including a negative electrode, a positive electrode, one or more separators, and the reference electrodes. Electrochemical analysis using a side-mounted reference electrode has certain disadvantages. First, voltage measurements at the periphery of the electrode stack may be inaccurate, particularly at high current densities. Utilization of the anode and the cathode at high current densities (e.g., current densities greater than or equal to 5 mA/cm$^2$) may be non-uniform such that the voltage at a center of the electrode (i.e., the target measurement) is different than a voltage at a periphery of the electrode (i.e., the actual measurement). Second, electrode alignment, which is susceptible to shifting during assembly of the electrode stack within a test device, has a heightened importance when side-mounted electrodes are used. More particularly, because potential is typically measured at a midpoint between the positive electrode and the negative electrode, misalignment of one of the electrodes may cause the measured potential to be biased closer to one electrode or the other. Movements as small as fractions of a millimeter can cause inaccurate voltage measurements.

In various aspects, the present disclosure provides a device for performing electrochemical analysis on an electrochemical cell. The device may accommodate an electrode stack including three electrodes: an anode, a cathode, and a center-mounted reference electrode. The use of the center-mounted reference electrode enables the measurement of voltages at the respective centers of the anode and cathode and minimizes the importance of electrode stack alignment. Furthermore, the use of the center-mounted reference electrode may be particularly advantageous at high current densities, such as current densities greater than or equal to 5 mA/cm$^2$, optionally greater than or equal to 5 mA/cm$^2$ and less than or equal to 20 mA/cm$^2$, optionally greater than or equal to 10 mA/cm$^2$ and less than or equal to 15 mA/cm$^2$.

The device may include mechanical alignment features to enable a minimally-trained operator to handle and assemble the electrode stack and the device for analysis. The use of easy-to-handle components having alignment features is particularly advantageous when the operator is required to work in an inert environment, such as a glovebox, and wear bulky protective equipment, such as gloves that reduce dexterity (e.g., when a lithium ion battery cell is assembled in an inert environment). The device may include a stable support for all three electrodes of the electrode stack and reliable electrical connections for connection to an external circuit (e.g., a circuit that includes test equipment). The electrical connections may include two distinct connections to the anode so that its voltage can be measured on a front side and a back side. The reliability of the device makes it useful for a broad range of electroanalytical techniques for characterizing an electrochemical cell at any stage of life. The measurements may be unobtrusive such that they do not alter the performance characteristics of the cell. Measurements may include calibrations pertaining to fast charge, lithium plating, state of charge, and power estimation, by way of non-limiting example.

With reference to FIG. 1, an electrode stack 10 is provided. The electrode stack may include a negative electrode or anode 12, a positive electrode or cathode 14, a separator 16, and a reference electrode assembly 18. The negative electrode 12, positive electrode 14, separator 16, and reference electrode assembly 18 may be stacked one on top of another and be aligned along a center axis 20. The negative electrode 12 may be disposed at a first or upper end of the electrode stack 10 and the positive electrode 14 may be disposed at a second or bottom end of the electrode stack 10 opposite the negative electrode 12. The separator 16 may be disposed between the negative electrode 12 and the positive electrode 14. The reference electrode assembly 18 may be disposed between the negative electrode 12 and the separator 16.

By way of non-limiting example, a negative electrode 12 may include a lithium insertion material or an alloy host material. Typical electroactive materials for forming an anode include: lithium-graphite intercalation compounds, lithium-silicon intercalation compounds, lithium-tin intercalation compounds, and lithium alloys. The negative electrode 12 may also be made of metallic lithium, so that the electrochemical cell is considered a lithium metal battery or cell. In certain variations, the negative electrode 12 may also include an electrically conductive material, as well as one or more polymeric binder materials to structurally hold the electroactive material and optional electrically conductive material together.

The positive electrode 14 may be formed from a lithium-based active material that can sufficiently undergo lithium intercalation and deintercalation, alloying and dealloying, or plating and stripping. Electroactive materials for the positive electrode 14 may include one or more transition metals, such as manganese (Mn), nickel (Ni), cobalt (Co), chromium (Cr), iron (Fe), vanadium (V), and combinations thereof. Two exemplary common classes of known electroactive materials that can be used to form the positive electrode 14 are lithium transition metal oxides with layered structure and lithium transition metal oxides with spinel phase. In a lithium-sulfur battery, positive electrodes may have elemental sulfur as the active material or a sulfur-containing active material. In certain variations, such active materials may be intermingled with an optional electrically conductive material and at least one polymeric binder material to structurally fortify the lithium-based active material along with an optional electrically conductive particle distributed therein.

The separator 16 may be a porous and may operate as both an electrical insulator and a mechanical support, by being sandwiched between the negative electrode 12 and the positive electrode 14 to prevent physical contact and thus, the occurrence of a short circuit. The separator 16, in addition to providing a physical barrier between the two electrodes 12, 14, can provide a minimal resistance path for internal passage of lithium ions (and related anions) during cycling of the lithium ions to facilitate functioning of an electrochemical cell.

The separator 16 may include, in certain instances, a microporous polymeric separator including a polyolefin, by way of non-limiting example. The polyolefin may be a homopolymer (derived from a single monomer constituent) or a heteropolymer (derived from more than one monomer constituent), which may be either linear or branched. If a heteropolymer is derived from two monomer constituents, the polyolefin may assume any copolymer chain arrangement, including those of a block copolymer or a random copolymer. Similarly, if the polyolefin is a heteropolymer derived from more than two monomer constituents, it may likewise be a block copolymer or a random copolymer. In certain aspects, the polyolefin may be polyethylene (PE), polypropylene (PP), or a blend of PE and PP, or multi-layered structured porous films of PE and/or PP.

The reference electrode assembly 18 may include another separator 22 having a first surface 24 (or first separator surface) and a second surface 26 (or second separator surface) opposite the first surface 24. The separator 22 may be similar to the separator 16 described above. The first surface 24 may be disposed toward the negative electrode 12 and the second surface 26 may be disposed toward the positive electrode 14. A reference electrode 28 may be disposed on the second surface 26. A negative electrode contact 30 may be disposed on first surface 24. One suitable example of the reference electrode assembly 18 is discussed in U.S. patent application Ser. No. 15/252,539 (Filing Date: Aug. 31, 2016; Title: "Reference Electrode"; Inventors: Brian J. Koch, Ashley McAllister, Robert S. Conell), herein incorporated by reference in its entirety.

The negative electrode 12 and the positive electrode 14 may both be disc shaped, although this shape is non-limiting. In such a variation, the separator 16 may have the same shape as the negative electrode 12 and positive electrode 14, here a disc-shaped body 32 with two opposing tabs 34 extending from a perimeter of the disc-shaped body 32. The separator 22 of the reference electrode assembly 18 may have a disc-shaped body 36 and first and second opposing tabs 38-1, 38-2 extending from a perimeter of the disc-shaped body 36. The reference electrode 28 may be disc-shaped and have a smaller diameter than the disc-shaped body of the separator 22. The reference electrode 28 may be centered along the center axis 20. The negative electrode contact 30 may extend from a center of the separator 22 (i.e., aligned with the center axis 20) to the first opposing tab 38-1. The reference electrode assembly 18 may include a reference electrode connector 42 extending from the reference electrode 28 to the second opposing tab 38-2.

The negative electrode contact 30 may directly engage and be electrically connected to the negative electrode 12. The negative electrode contact 30 may comprise a metal, such as copper, that is sputtered on a first surface of the separator 22. The negative electrode contact 30 may be thin and porous (such that ions can pass through the negative electrode contact 30). The separator 22 may be disposed between the negative electrode contact 30 and the reference electrode 28 to prevent direct contact between the negative electrode contact and the reference electrode 28. The reference electrode 28 may engage the separator 16.

The reference electrode 28 may be porous (such that ions can pass through the reference electrode 28). The reference electrode 28 may include a material that has substantially constant voltage regardless of the state of charge, with the exception of a very low state of charge or a very high state of charge. The relatively constant voltage can be compared to voltages at other points in an electrochemical cell. The reference electrode 28 may include a lithium intercalation compound, which may be a metal oxide such as lithium iron phosphate and lithium titanate, by way of non-limiting example. The reference electrode 28 may exhibit a constant equilibrium potential over a broad range of x values (e.g., 0.1<x<0.9). As fabricated, the reference electrode 28 is typically not within the bounds of the above range, so it may be charged by removing lithium before use. A separate, auxiliary reference electrode (see, e.g., auxiliary electrode 330 of FIG. 4A), which may be side-mounted, can be used to set a voltage of the reference electrode 28. In various aspects, in a lithium ion battery, the auxiliary electrode may include lithium metal, by way of non-limiting example. In a sodium ion battery, the auxiliary electrode may include metallic sodium, by way of non-limiting example.

Figure 3:
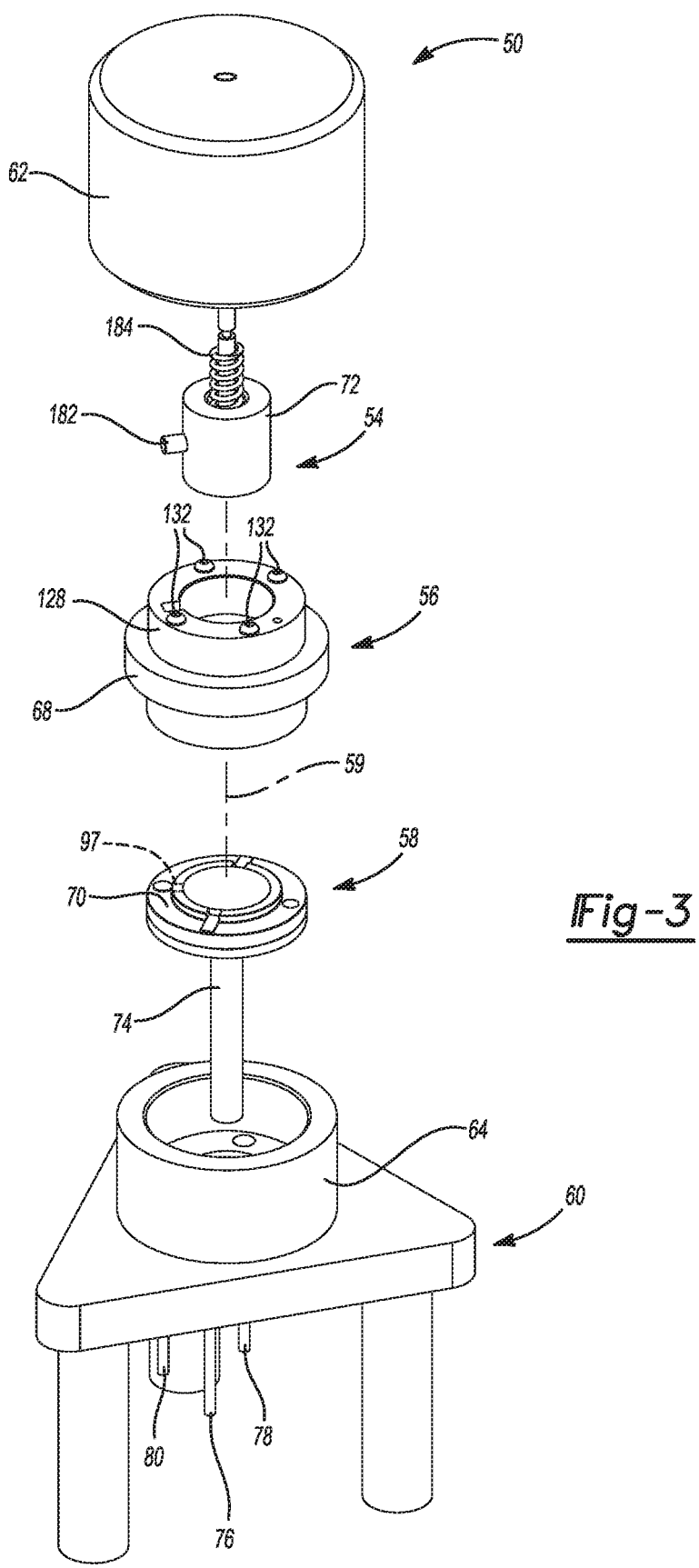
FIG. 3 is a perspective view of the three-electrode device of FIG. 2 in a partially-assembled state.

Referring to FIGS. 2-3, a three-electrode device or fixture 50 (the "device") according to certain aspects of the present disclosure is provided. The device 50 may be used to perform electrochemical analysis on an electrochemical cell, such a lithium ion battery. More specifically, the electrode stack 10 can be connected to the device 50 to monitor individual negative electrode 12 and positive electrode 14 potentials during cycling. The electrode stack 10 is removable from the device 50 so that different electrode stacks 10 can be tested. In certain variations, the separator 16 and/or the reference electrode assembly 18 may be considered part of the device. In other variations, different separators 16 and reference electrode assemblies 18 are used for each different negative electrode 12 and positive electrode 14 that are tested in the device 50.

The device 50 may generally include a housing 52, a first or upper current collector assembly 54, an internal assembly 56, a second or lower current collector assembly 58 aligned along a central axis or device axis 59. The device 50 may also include a stand 60. The housing 52 may include a first or upper enclosure 62 (also referred to as the cap 62) and a second or lower enclosure 64. In certain variations, the separator 16 and/or the reference electrode assembly 18 are considered to be part of the device 50.

With reference to FIGS. 4A-5C, the upper and lower enclosures 62, 64 may cooperate to define an inner chamber 66 having the device axis 59 extending therethrough. The internal assembly 56 may be disposed entirely within the inner chamber 66 when the device 50 is assembled. The upper and lower current collector assemblies 54, 58 may each be at least partially disposed within the inner chamber 66 and extend outside of the housing 52 for connection to an external circuit (not shown) for electrochemical analysis. The electrode stack 10 may be disposed within the inner chamber 66 so that the center axis 20 of the electrode stack 10 is substantially aligned with the device axis 59. As will be described in greater detail below, a first or upper stack holder 68 within the internal assembly 56 and a second or lower stack holder 70 in the lower current collector assembly 58 may cooperate to fix the electrode stack 10 for analysis. The electrode stack 10 may be electrically connected to a first current collector 72 in the upper current collector assembly 54, a second current collector 74 in the lower current collector assembly 58, and a third current collector 76, a fourth current collector 78, and a fifth current collector 80 in the lower enclosure 64 of the housing 52.

The lower current collector assembly 58 may include the lower stack holder 70, the second current collector 74, an axial pin 84, and a first conductive disc 85. The lower stack holder 70 (FIG. 4C) may include an annular body 86 (or "lower annular body") defining a centrally-disposed opening 88 (or "lower centrally-disposed opening"). The device axis 59 may extend through a center of the lower centrally-disposed opening 88. The lower annular body 86 may include a first or upper surface 90 (or "first lower stack surface") and a second or lower surface 92 (or "second lower stack surface") opposite the first surface 90. The first and second surfaces 90, 92 may be planar, substantially parallel to one another, and substantially perpendicular to the device axis 59. An annular projection 94 may extend in an axial direction (i.e., parallel to the device axis 59) from the first surface 90. The annular projection 94 may be disposed adjacent to the lower centrally-disposed opening 88 and have an inner peripheral surface 95. The annular projection 94 may include two opposing cutouts or passages 96 having respective surfaces that are coplanar or flush with the first surface 90. The cutouts 96 may be open to the lower centrally-disposed opening 88. The annular projection 94 may also include a radial aperture 97. The radial aperture 97 may be axially-centered on the annular projection 94. In various aspects, the radial aperture 97 may have a diameter of greater than or equal to about 0.5 mm and less than or equal to about 0.75 mm.

The lower annular body 86 may further define a plurality of circumferentially-disposed apertures 98, which may include four apertures. Each circumferentially-disposed aperture 98 may be equally-spaced between two other circumferentially-disposed apertures 98. The circumferentially-disposed apertures 98 may extend between the first surface 90 and the second surface 92. The apertures 98 may extend substantially parallel with the device axis 59 (i.e., axes of the apertures 98 are substantially parallel to the device axis 59) The plurality of circumferentially-disposed apertures 98 may include a first aperture 98-1 (or "first stack aperture"), a second aperture, 98-2 (or "second stack aperture"), a third aperture 98-3 (or "third stack aperture"), and a fourth aperture 98-4 (or "fourth stack aperture"). The first aperture 98-1 may be disposed opposite the second aperture 98-2 and the third aperture 98-3 may be disposed opposite the fourth aperture 98-4. The first and second apertures 98-1, 98-2 may be disposed adjacent to the cutouts 96. The radial aperture 97 may be disposed adjacent to the third aperture 98-3.

The second current collector 74 may include a stage 104, a cylindrical stem 106, and a radially-extending flange 108 disposed axially-between the stage 104 and the stem 106. In various aspects, the stage 104 and the flange 108 may be collectively referred to as the cylindrical body (or "second cylindrical body"). The stage 104, the stem 106, and the flange 108 may be coaxial such that their centers are aligned with one another. Furthermore, the respective centers of the stage 104, the stem 106, and the flange 108 may be aligned with the device axis 59. The stage 104 may include a first or upper surface 110 (or "first body surface") extending substantially perpendicular to the device axis 59 and a peripheral surface 112 extending substantially perpendicular to the first surface 110. The flange 108 may include a flange surface 114 and a second or lower surface 116 (or "second body surface") opposite the flange surface 114. The flange and second surfaces 114, 116 may be planar, substantially parallel to one another, and substantially perpendicular to the device axis 59. The flange 108 may define a plurality of circumferentially-disposed apertures 118 that extend between the flange surface 114 and the second surface 116. The circumferentially-disposed apertures 118 may extend substantially parallel to the device axis 59. The plurality of circumferentially-disposed apertures 118 may include a first aperture 118-1 (or "first flange aperture"), a second aperture 118-2 (or "second flange aperture"), a third aperture 118-3 (or "third flange aperture"), and a fourth aperture 118-4 (or "fourth flange aperture"). Each circumferentially-disposed aperture 118 may be equally-spaced between two other circumferentially-di sposed apertures 118.

The first conductive disc 85 may be placed on the first surface 110 of the stage 104. The lower stack holder 70, the second current collector 74, and the first conductive disc 85 may be aligned along the device axis 59. The first, second, third, and fourth apertures 98-1, 98-2, 98-3, 98-4 of the lower stack holder 70 may be aligned with respective first, second, third, and fourth apertures 118-1, 118-2, 118-3, 118-4 of the second current collector 74. The flange surface 114 of the second current collector 74 may engage the second surface 92 of the lower stack holder 70. The first conductive disc 85 and the stage 104 of the second current collector 74 may be at least partially disposed within the lower centrally-disposed opening 88 of the lower stack holder 70. A fit between the stage 104 and the lower centrally-disposed opening 88 may be snug such that the peripheral surface 112 of the stage 104 engages the inner peripheral surface 95 of the annular projection 94 of the lower stack holder 70. The axial pin 84 may extend through the fourth apertures 98-4, 118-4 to prevent the second current collector 74 from rotating about the device axis 59 with respect to the lower stack holder 70.

The internal assembly 56 may include the upper stack holder 68, a plurality of pressure pins 124, a plurality of compression springs 126, a spring-retaining cap 128, a second conductive disc 130, a plurality of threaded fasteners 132, and an O-ring 134 (FIG. 5A). The upper stack holder 68 may have an annular body 138 (or "upper annular body") defining a centrally-disposed opening 139 (or "upper centrally-disposed opening"). The device axis 59 may extend through the upper centrally-disposed opening 139. The upper annular body 138 may have a first or upper surface 140 (or "first upper stack surface") and a second or lower surface 142 (or "second upper stack surface") opposite the first surface 140. The first and second surfaces 140, 142 may be planar and extend substantially parallel to one another and substantially perpendicular to the device axis 59. The first surface 140 may define an indentation or pocket 143 adjacent to the upper centrally-disposed opening 139 and open to the upper centrally-disposed opening 139. The pocket 143 may not extend all the way through the upper annular body 138 to the second surface 142. The second surface 142 may define an annular groove 144 (FIG. 5A). The annular groove 144 may be disposed adjacent to the upper centrally-disposed opening 139 and may be open to the upper centrally-disposed opening 139. The upper annular body 138 may include a plurality of circumferentially-disposed apertures, which may be a plurality of counterbores 145. The counterbores 145 may extend from the first surface 140 to the second surface 142. The counterbores 145 may extend substantially parallel to the device axis 59. The second surface 142 may further define an aperture 146 (FIG. 5C) disposed radially outward from the annular groove 144. The aperture 146 may be a blind hole.

The upper annular body 138 may further define a plurality of circumferentially-disposed threaded apertures 147. The threaded apertures 147 may extend substantially parallel to the device axis 59. The plurality of threaded apertures 147 may include multiple (e.g., four) distinct threaded apertures. Respective centers of the counterbores 145 and the threaded apertures 147 may be disposed at substantially the same radius with respect to the device axis 59.

The upper annular body 138 may include a radially-extending flange 148. The radially-extending flange 148 may be disposed adjacent to the first surface 140 the upper annular body 138. The radially-extending flange 148 may include a third surface 149 opposite the first surface 140 and substantially parallel to the first surface 140. The first surface 140 may define an annular groove 150. The O-ring 134 (FIG. 5A) may be at least partially disposed within the annular groove 150.

The plurality of pressure pins 124 may include a first pressure pin 124-1, a second pressure pin 124-2, and a third pressure pin 124-3. Each pressure pin 124 may include a shaft 156 and a head 158. The pressure pins 124 may be at least partially disposed within the counterbores 145. More specifically, the first pressure pin 124-1 may be at least partially disposed within the first counterbore 145-1, the second pressure pin 124-2 may be at least partially disposed within the second counterbore 145-2, and the third pressure pin 124-3 may be at least partially disposed within the third counterbore 145-3.

The plurality of compression springs 126 may include a first compression spring 126-1, a second compression spring 126-2, and a third compression spring 126-3. The compression springs 126 may be at least partially disposed within the counterbores 145. More specifically, the first compression spring 126-1 may be at least partially disposed within the first counterbore 145-1, the second compression spring 126-2 may be at least partially disposed within the second counterbore 145-2, and the third compression spring 126-3 may be at least partially disposed within the third counterbore 145-3. The compression springs 126 may engage respective heads 158 of the pressure pins 124.

The spring-retaining cap 128 may include an annular body 166 (or "cap annular body") defining a centrally-disposed opening 168 (or "cap centrally-disposed opening"). The device axis 59 may extend through the cap centrally-disposed opening 168. The spring-retaining cap 128 may include a first or upper surface 170 and a second or lower surface 172 opposite the first surface 170. The first and second surfaces 170, 172 may be planar and may extend substantially parallel to one another and substantially perpendicular to the device axis 59. The cap annular body 166 may define a plurality of apertures 174. A quantity of apertures in the plurality of apertures 174 may be equal to a quantity of threaded apertures 147 in the upper stack holder 68. Thus, the plurality of apertures 174 may include four apertures 174. The cap annular body 166 may further include an axial groove 176 extending from the first surface 170 to the second surface 172. The axial groove 176 may be disposed adjacent to the cap centrally-disposed opening 168 and may be open to the cap centrally-disposed opening 168.

The upper stack holder 68 and the spring-retaining cap 128 may be aligned along the device axis 59. The plurality of apertures 174 in the spring-retaining cap 128 may be aligned with the plurality of threaded apertures 147 in upper stack holder 68 such that the apertures 174 are coaxial with respective threaded apertures 147. The axial groove 176 of the spring-retaining cap 128 may be axially aligned with the pocket 143 of the upper stack holder 68. The second surface 172 of the cap annular body 166 of the spring-retaining cap 128 may engage the first surface 140 of the upper annular body 138 of the upper stack holder 68. Such engagement may compress or energize the compression springs 126 to ensure that the compression springs 126 maintain contact with the pressure pins 124.

The plurality of threaded fasteners 132 may include four threaded fasteners 132. The threaded fasteners 132 may extend through respective apertures 174 in the spring-retaining cap 128 and into respective threaded apertures 147 of the upper stack holder 68 to fix the spring-retaining cap 128 to the upper stack holder 68. More specifically, threads of the threaded fasteners 132 may engage respective mating threads of the threaded apertures 147. Thus, the compression springs 126 and the pressure pins 124 are held within the respective counterbores 145. The second conductive disc 130 may be at least partially disposed within the upper centrally-disposed opening 139 of the upper stack holder 68.

The upper current collector assembly 54 (FIG. 4B) may include the first current collector 72, a radial pin 182, a central compression spring 184, and an O-ring 186 (FIG. 5A). The first current collector 72 may include a cylindrical body 192 ("first cylindrical body") extending along the device axis 59. The cylindrical body 192 may include a first or upper surface 194 and a second or lower surface 196. The first and second surfaces 194, 196 may be planar and may extend substantially parallel to one another and substantially perpendicular to the device axis 59. The first surface 194 may define a central cylindrical depression 198. A cylindrical stem 200 may extend from a lower surface of the central cylindrical depression 198. The stem 200 may extend toward the first surface 194 and past the first surface 194.

The central compression spring 184 may be disposed around an outer surface 202 of the stem 200. An end of the central compression spring 184 may be disposed within the central cylindrical depression 198. The outer surface 202 of the stem 200 may define a circular groove 204. The circular groove 204 may extend radially inward from the outer surface 202 of the stem 200. The O-ring 186 (FIG. 5A) may be at least partially disposed within the circular groove 204.

The cylindrical body 192 may include a peripheral surface 206. The peripheral surface 206 may define a radially-inwardly-extending cylindrical aperture 208. The aperture 208 may be a blind hole. The radial pin 182 may be partially disposed within the aperture 208. The radial pin 182 may project radially outward from the peripheral surface 206 of the cylindrical body 192 of the first current collector 72.

The lower enclosure 64 of the housing 52 may include a base 216, three connectors 218, a threaded connector 219, the third current collector 76, the fourth current collector 78, the fifth current collector 80, and an O-ring 220 (FIG. 5A). The base 216 (FIG. 4D) may include a cylindrical body 226 ("base cylindrical body") extending along the device axis 59. The base 216 may include a first or upper surface 228 and a second or lower surface 230 opposite the first surface 228. The first and second surfaces 228, 230 may be planar and may extend substantially parallel to one another and substantially perpendicular to the device axis 59.

The base cylindrical body 226 may include an outer peripheral surface 232. The outer peripheral surface 232 may define a plurality of threads 233 (FIG. 5A). In various aspects, the plurality of threads 233 may be referred to as the first plurality of threads 233. The threads 233 may be disposed adjacent to the first surface 228. The first surface 228 may define a cylindrical cavity 234. In various aspects, the cavity 234 may be referred to as the first cavity 234. The cylindrical cavity 234 may include an inner peripheral surface 236 and a third surface 238 substantially parallel to the first surface 228.

A central axial opening 240 (FIG. 5A) may extend between the third surface 238 and the second surface 230. The central axial opening 240 may be substantially cylindrical. The third surface 238 may define an annular groove 242 disposed radially outward from the central axial opening 240. The O-ring 220 (FIG. 5A) may be at least partially disposed in the annular groove 242. The third surface 238 may also define a blind hole 243 disposed radially outward of the annular groove 242.

The base cylindrical body 226 may further include three apertures 244. Each aperture 244 may extend between the third surface 238 and the second surface 230 and may include an upper portion 246 and a lower portion 248 (FIG. 5A). The upper portion 246 may be unthreaded and may have a smaller diameter than the lower portion 248. The lower portion 248 may be threaded and may have a larger diameter than the upper portion 246. The apertures 244 may be disposed radially outward from the annular groove 242. The apertures 244 may include a first aperture, a second aperture, and a third aperture.

Each of the connectors 218 may include a cylindrical body 254 having a first or upper surface 256 and a second or lower surface 258 opposite the first surface 256. A threaded shaft 260 may project axially from the first surface 256 (threads shown on FIG. 5A). The threaded shaft 260 may include a third surface 262 substantially parallel to the first surface 256. A central aperture 264 may extend between the third surface 262 and the first surface 256. The first surface 256 of the connectors 218 may engage the second surface 230 of the base 216. The central apertures 264 of the connectors 218 may be aligned with the upper portions 246 of the apertures 244 in the base 216. The connectors 218 may include a first connector 218-1, a second connector 218-2, and a third connector 218-3.

The connectors 218 may be fixed to the base 216. More specifically, the threaded shafts 260 of the connectors 218 may engage respective threaded lower portions 248 of the apertures 244. The first connector 218-1 may be at least partially disposed within the first aperture 244-1, the second connector 218-2 may be at least partially disposed within the second aperture 244-2, and the third connector 218-3 may be at least partially disposed within the third aperture 244-3. The threaded connector 219 may be a nut.

The third current collector 76 may have an elongated cylindrical body 270 (or "third cylindrical body"). In various aspects, the third current collector 76 may be a first wire. The third current collector 76 may include a first or upper end 272 and a second or lower end 274 opposite the first end 272. The first end 272 may be disposed within the inner chamber 66 and the second end 274 may extend outside of the housing 52 (FIG. 2) for connection to the external circuit. The third current collector 76 may be at least partially disposed within the first aperture 244-1 of the base 216 and the aperture 264 of the first connector 218-1. A friction fit between the third current collector 76 and the aperture 264 of the first connector 218-1 may retain the third current collector 76 within the aperture 264. Additionally, an epoxy seal ring (not shown) may be presented at an interface between the third current collector 76 and the aperture 264 of the first connector 218-1 to form a hermetic seal. The first end 272 of the third current collector 76 may project beyond the third surface 238 of the cavity 234 of the base 216.

The fourth current collector 78 may have an elongated cylindrical body 278 (or "fourth cylindrical body"). In various aspects, the fourth current collector 78 may be a second wire. The fourth current collector 78 may include a first or upper end 280 and a second or lower end 282 opposite the first end 280. The first end 280 may be disposed within the inner chamber 66 and the second end 282 may extend outside of the housing 52 (FIG. 2) for connection to the external circuit. The fourth current collector 78 may be at least partially disposed within the second aperture 244-2 of the base 216 and the aperture 264 of the second connector 218-2. A friction fit between the fourth current collector 78 and the aperture 264 of the second connector 218-2 may retain the current collector within the aperture 264. Additionally, an epoxy seal ring (not shown) may be present at an interface between the fourth current collector 78 and the aperture 264 of the second connector 218-2 to form a hermetic seal. The first end 280 of the fourth current collector 78 may project beyond the third surface 238 of the cavity 234 of the base 216.

The fifth current collector 80 may have an elongated cylindrical body 286 (or "fifth cylindrical body"). In various aspects, the fifth current collector 80 may be a third wire. The fifth current collector 80 may include a first or upper end 288 and a second or lower end 290 opposite the first end 288. The first end 288 may be disposed within the inner chamber 66 and the second end 290 may extend outside of the housing 52 (FIG. 2) for connection to the external circuit. The fifth current collector 80 may be at least partially disposed within the third aperture 244-3 of the base 216 and the aperture 264 of the third connector 218-3. A friction fit between the fifth current collector 80 and the aperture 264 of the third connector 218-3 may retain the fifth current collector 80 within the aperture 264. Additionally, an epoxy seal ring (not shown) may be present at an interface between the fifth current collector 80 and the aperture 264 of the third connector 218-3 to form a hermetic seal. The first end 288 of the fifth current collector 80 may project beyond the third surface 238 of the cavity 234 of the base 216.

The upper enclosure or cap 62 (FIG. 4B) may include a cylindrical body 296 ("cap cylindrical body") having a first or upper surface 298 and a second or lower surface 300 opposite the first surface 298. The first and second surfaces 298, 300 may be planar and may extend substantially parallel to one another and substantially perpendicular to the device axis 59. The second surface 300 may define a cavity 302 (FIG. 5A). In various aspects, the cavity 302 may be referred to as the second cavity 302. The cap cylindrical body 296 may also include an outer peripheral surface 304. The cavity 302 may include a third surface 306 (FIG. 5A) substantially parallel to the second surface 300. The third surface 306 may define a central axial opening 308 extending along the device axis 59. The central axial opening 308 may be substantially cylindrical and may extend between the first surface 298 and the third surface 306.

The cavity 302 may also include a first or upper inner peripheral surface 310 and a second or lower inner peripheral surface 312 (FIG. 5A). A fourth surface 311 that is substantially parallel to the third surface 306 may be disposed between the first and second inner peripheral surfaces 310, 312. The fourth surface 311 may be substantially perpendicular to the first and second inner peripheral surfaces 310, 312. The first inner peripheral surface 310 may have a smaller diameter second inner peripheral surface 312. The second inner peripheral surface 312 may include a plurality of threads 320. In various aspects, the plurality of threads 320 may be referred to as the second plurality of threads 320. The threads 320 may be disposed adjacent to the second surface 300.

The stand 60 (FIG. 4D) may include a planar base 322. In various aspects, the planar base 322 may be triangular. An aperture 321 may extend through the planar base 322. The stand 60 may also include a plurality of legs 323. The legs 323 may extend substantially parallel to the device axis 59 and substantially perpendicular to the planar base 322. The plurality of legs 323 may include three legs 323.

The lower current collector assembly 58 may be aligned with the lower enclosure 64 along the device axis 59 and assembled to the lower enclosure 64. Proper alignment may be facilitated by placement of the axial pin 84 in the blind hole 243 of the base 216. The third, fourth, and fifth current collectors 76, 78, 80 may be axially aligned with the first, second, and third apertures 118-1, 118-2, 118-3 of the second current collector 74 and the first, second, and third apertures 98-1, 98-2, 98-3 of the lower stack holder 70, respectively. The third, fourth, and fifth current collectors 76, 78, 80 may be extend through the first, second, and third apertures 118-1, 118-2, 118-3 of the second current collector 74 and the first, second, and third apertures 98-1, 98-2, 98-3 of the lower stack holder 70, respectively. A surface of the first end 272 of the third current collector 76, a surface of the first end 280 of the fourth current collector 78, and a surface of the first end 288 of the fifth current collector 80 may be substantially coplanar with the first surface 90 of the lower stack holder 70.

The stem 106 of the second current collector 74 may extend through the central axial opening 240 of the base 216. In various aspects, the stem 106 may be threaded. The threaded connector 219 may be threaded onto the stem 106 to secure the stem 106 to the base 216.

The first conductive disc 85 may include a first or upper surface 324 and a second or lower surface 325 opposite the first surface 324. The conductive disc 85 may be placed on top of the stage 104 of the second current collector 74 so that second surface 325 of the first conductive disc 85 engages the first surface 110 of the stage 104. Thus, the conductive disc 85 may be in electrical contact with the second current collector 74.

The lower stack holder 70, the first conductive disc 85, and the stage 104 and the flange 108 of the second current collector 74 may be disposed within the cavity 234 of the base 216. The second surface 116 of the flange 108 of the second current collector 74 may engage the third surface 238 of the cavity 234. Additionally, the second surface 116 of the flange 108 second current collector 74 may engage the O-ring 220 to form a hermetic seal between the second current collector 74 and the base 216.

The lower centrally-disposed opening 88 of the lower stack holder 70 and the upper centrally-disposed opening 139 of the upper stack holder 68 may cooperate to define an electrode stack chamber 326 to house the electrode stack 10 for electrochemical analysis. The positive electrode 14 may be placed onto the first surface 324 of the first conductive disc 85. Thus, the positive electrode 14 may be in physical and electrical contact with the first conductive disc 85, and therefore also the second current collector 74. However, in various alternative embodiments, the first conductive disc 85 may be omitted so that the positive electrode 14 is in direct contact with the first surface 110 of the stage 104. The positive electrode may be disc-shaped and may have a similar diameter as the first conductive disc 85 and the stage 104. The separator 16 may be placed on top of the positive electrode 14. More specifically, the disc-shaped body 32 of the separator 16 may be placed on top of the positive electrode 14 and the tabs 34 of the separator 16 may be disposed within the cutouts 96 of the lower stack holder 70.

The reference electrode assembly 18 may be placed on top of the separator 16. The second surface 26 of the separator 22 of the reference electrode assembly 18 including the reference electrode 28 may be disposed toward the separator 16. In various aspects, the reference electrode 28 may be referred to as the center-mounted reference electrode 28. The first and second opposing tabs 38-1, 38-2 may be disposed within the cutouts 96 of the lower stack holder 70. A portion of the reference electrode connector 42 of the reference electrode 28 may be axially aligned with the first aperture 98-1 of the lower stack holder 70. Thus, the portion of the reference electrode connector 42 of the reference electrode 28 may be electrically connected to the third current collector 76.

The negative electrode 12 may be placed onto the first surface 24 of the separator 22 of the reference electrode assembly 18. The negative electrode may be in physical and electrical contact with the negative electrode contact 30 of the reference electrode assembly 18. A portion of the negative electrode contact 30 on the first surface 24 of the separator 22 of the reference electrode assembly 18 may be axially aligned with the second aperture 98-2 of the lower stack holder 70. Thus, the portion of the negative electrode contact 30 may be electrically connected to the fourth current collector 78.

An auxiliary electrode 330 may be used to set a potential of the reference electrode 28. The auxiliary electrode 330 may be placed on the first surface 90 of the lower stack holder 70 over the third aperture 98-3. The auxiliary electrode 330 may be disc-shaped. The auxiliary electrode 330 may have a small enough diameter that it is not in physical or electrical contact with the electrode stack 10. An entire surface of the auxiliary electrode 330 may be disposed on the first surface 90 of the lower stack holder 70 so that the auxiliary electrode 330 does not overhang an edge of the lower stack holder 70.

The second conductive disc 130 may include a first or upper surface 340 and a second or lower surface 342 opposite the first surface 340. The second surface 342 of the second conductive disc 130 may be placed on top of the negative electrode 12 so that the second conductive disc 130 and the negative electrode 12 are physically and electrically connected to one another. In various embodiments, a diameter of the negative electrode 12 may be substantially equal to a diameter of the second conductive disc 130.

The upper stack holder 68 may be placed on the lower stack holder 70 so that the electrode stack 10 is sandwiched between the lower stack holder 70 and the upper stack holder 68. The first surface 90 of the lower stack holder 70 may engage the second surface 142 of the upper stack holder 68. More particularly, the first, second, and third pressure pins 124-1, 124-2, 124-3 may be axially aligned with the first, second, and third apertures 98-1, 98-2, 98-3 of the lower stack holder 70. Proper alignment of the upper stack holder 68 with the lower stack holder 70 may be ensured by disposing the axial pin 84 of the lower current collector assembly 58 in the aperture 146 of the upper stack holder 68 (FIG. 5C). An annular gap 350 may be defined between the third surface 149 of the radially-extending flange 148 of the upper stack holder 68 and the first surface 228 of the base 216. An O-ring 352 may be disposed within the gap 350.

The first compression spring 126-1 may operatively engage the first pressure pin 124-1 to facilitate contact between the reference electrode connector 42 of the reference electrode 28 and the third current collector 76. The second compression spring 126-2 may operatively engage the second pressure pin 124-2 to facilitate contact between the negative electrode contact 30 on the reference electrode assembly 18 and the fourth current collector 78. The third compression spring 126-3 may operatively engage the third pressure pin 124-3 to facilitate contact between the auxiliary electrode 330 and the fifth current collector 80. The compression springs 126 may be selected to ensure that there is electrical contact between the third, fourth, and fifth connectors 76, 78, 80 and the reference electrode 28, the negative electrode contact 30, and the auxiliary electrode 330, respectively.

The upper current collector assembly 54 may engage the internal assembly 56. The first current collector 72 may be at least partially disposed within the upper centrally-disposed opening 139 of the upper stack holder 68. The radial pin 182 of the upper current collector assembly 54 may be aligned with the axial groove 176 in the spring-retaining cap 128 and the pocket 143 of the upper stack holder 68 (FIG. 5B). The radial pin 182 may be disposed within the pocket 143 of the upper stack holder 68 to prevent rotation of the first current collector 72 with respect to the upper stack holder 68. The second surface 196 of the first current collector 72 may engage the first surface 340 of the second conductive disc 130 so that the first current collector 72 and the second conductive disc 130 are in physical and electrical contact with one another. Therefore, the first current collector 72 may be in electrical contact with the negative electrode 12. However, in various alternative embodiments, the second conductive disc 130 may be omitted so that the second surface 196 of the first current collector 72 directly engages the negative electrode 12.

The cap 62 may be assembled to the base 216 to enclose the electrode stack 10, the auxiliary electrode 330, and the internal assembly 56 within the hermetically-sealed inner chamber 66. The stem 200 of the first current collector 72 may be disposed within the central axial opening 308 of the cap 62. The threads 320 of the cap 62 may engage the threads 233 of the base 216 to fix the cap 62 to the base 216 (FIG. 5A). As the cap 62 is threaded onto the base 216, the central compression spring 184 of the upper current collector assembly 54 is compressed and energized. Compression of the central compression spring 184 facilitates contact between the first current collector 72, the second conductive disc 130, and the negative electrode 12. Compression of the central compression spring 184 also facilitates contact between the positive electrode 14, the first conductive disc 85, and the second current collector 74. The central compression spring 184 may be selected to provide comparable compression of the electrode stack 10 to that found in a vehicle.

The O-ring 352 may slightly compress when the cap 62 is fully engaged with the base 216. The O-ring 352 may engage the third surface 149 of the upper stack holder 68 and the first surface 228 of the base 216 to form a hermetic seal between the upper stack holder 68 and the base 216. The O-ring 186 may engage the stem 200 of the first current collector 72 and a surface of the central axial aperture of the cap 62 to form a hermetic seal between the cap 62 and the first current collector. The O-ring 134 may engage the annular groove 150 of the first surface 140 of the upper stack holder 68 and the fourth surface 311 of the cap 62 to form a hermetic seal between the upper stack holder 68 and the cap 62.

The upper enclosure 62, the base 216, the spring-retaining cap 128, the upper stack holder 68, the lower stack holder 70, the connectors 218, and the threaded connector 219 may all be formed from or include non-electrically-conductive or electrically insulating materials. The upper enclosure 62 and the base 216 of the housing 52 may be formed from or include a first non-electrically-conductive material, the upper stack holder 68 may be formed from or include a second non-electrically-conductive material, the lower stack holder 70 may be formed from or include a third non-electrically-conductive material, and the spring-retaining cap 128 may be formed from or include a fourth non-electrically-conductive material. The upper enclosure 62, the base 216, the spring-retaining cap 128, the upper stack holder 68, the lower stack holder 70, the connectors 218, and the threaded connector 219 may comprise the same non-electrically-conductive materials or different non-electrically-conductive materials. The non-electrically-conductive materials may be selected based on compatibility with the electrolyte to be used in electrochemical analysis. Suitable non-electrically-conductive materials include: polyetheretherketone (PEEK), polyaryletherketone (PAEK), polyetherketone (PEK), polyetheretheretherketone (PEEEK), polyetherketoneketone (PEKK), polyetheretherketoneketone (PEEKK), polyetherketoneetheretherketone (PEKEEK), polyetheretherketonetherketone (PEEKEK), poly(phenylene sulphide) (PPS), poly(sulphone) (PS), polyamide imide (PAI), polyimide (PI), machinable ceramics, and combinations thereof, by way of non-limiting example. In various aspects, each of the upper enclosure 62, the base 216, the spring-retaining cap 128, the upper stack holder 68, the lower stack holder 70, the connectors 218, and the threaded connector 219 comprises polyetheretherketone (PEEK). PEEK may be particularly suitable because it is machinable, dimensionally-stable such that it will not readily swell or soften, and does not chemically react with common electrolytes. In various aspects, suitable electrolytes for lithium ion batteries include a salt (e.g., lithium hexafluorophosphate, lithium tertrafluoroborate, or lithium perchlorate) in an organic carbonate solvent (e.g., ethylene carbonate, dimethyl carbonate, diethyl carbonate, ethyl methyl carbonate).

The first current collector 72, the second current collector 74, the third current collector 76, the fourth current collector 78, the fifth current collector 80, the first conductive disc 85, and the second conductive disc 130 all are formed from or include electrically-conductive materials. In various aspects, the first current collector 72 may be formed from or include a first electrically conductive material, the second current collector 74 may be formed from or include a second electrically-conductive material, the third current collector 76 may be formed from or include a third electrically-conductive material, the fourth current collector 78 may be formed from or include a fourth electrically-conductive material, the fifth current collector 80 may be formed from or include a fifth electrically-conductive material, the first conductive disc 85 may include a sixth electrically-conductive material, and the second conductive disc 130 may include a seventh electrically-conductive material. In various aspects, the first and seventh electrically-conductive materials may be the same. The use of the second conductive disc 130 may reduce wear to the first current collector 72. The second conductive disc 130 can be removed and replaced as needed. In various aspects, the second and sixth electrically-conductive materials may be the same. The use of the first conductive disc 85 may reduce wear to the second current collector 74. The first conductive disc 85 can be removed and replaced as needed.

Suitable electrically-conductive materials include copper, aluminum, gold, glassy carbon (or vitreous carbon), graphite, and combinations thereof, by way of non-limiting example. The electrically-conductive materials may be selected based on compatibility with the electrode (i.e., the negative electrode 12, the positive electrode 14, and the reference electrode 28). In various aspects, the first current collector, the fourth current collector 78, the fifth current collector 80, and the second conductive disc 130 include copper. Thus, the first, fourth, fifth, and seventh electrically-conductive materials may include copper. The second current collector 74 and the first conductive disc 85 include aluminum. Thus, the second and sixth electrically-conductive material may include aluminum. The third current collector 76 includes glassy carbon. Thus, the third electrically-conductive material may include glass carbon. Glassy carbon is extremely hard, resistive to chemical attack, and has excellent electrical conductivity. Furthermore, it is electrochemically inert at the potential of the reference electrode 28. Thus, it can function purely as an electrical contact. The use of glassy carbon for the third current collector 76 may prevent parasitic electrochemical reactions from causing a drift in the potential of the reference electrode 28. When the third current collector 76 includes glassy carbon, it may optionally be disposed within a brass tube (not shown).

In various aspects, the present disclosure provides a method of assembling the three-electrode device 50. The upper current collector assembly 54, the internal assembly 56, the lower current collector assembly 58, and the lower enclosure 64 may be substantially pre-assembled. The upper current collector assembly 54 may be preassembled to include the first current collector 72, the central compression spring 184, the radial pin 182, and the O-ring 186. The internal assembly 56 may be partially-preassembled to include the upper stack holder 68, the O-ring 134, the spring-retaining cap 128, the fasteners 132, the pressure pins 124, and the compression springs 126. The lower current collector assembly 58 may be preassembled to include the lower stack holder 70, the second current collector 74, and the axial pin 84. The lower enclosure 64 may be preassembled to include the base 216, the connectors 218, the third current collector 76, the fourth current collector 78, and the fifth current collector 80.

The lower current collector assembly 58 may be assembled to the lower enclosure 64. The stem 106 of the second current collector 74 can be inserted into the central axial opening 240 in the base 216. Proper alignment of the lower current collector assembly 58 with the lower enclosure 64 about the device axis 59 is facilitated by insertion of the axial pin 84 in the blind hole 243 of the base 216. The lower current collector assembly 58 can be fixed to the base 216 by threading the threaded connector 219 onto the stem 106 of the second current collector 74. The first conductive disc 85 may be placed onto the stage 104 of the second current collector 74. More particularly, the second surface 325 of the first conductive disc 85 engage the first surface 110 of the stage 104.

The electrode stack 10 can be placed onto the lower current collector assembly 58. More specifically, the positive electrode 14 may be placed on the first surface 324 of the first conductive disc 85. The separator 16 may be placed on top of the positive electrode 14 so that the disc-shaped body 32 of the separator covers the positive electrode 14 and the tabs 34 of the separator 16 extend through the cutouts 96 in the annular projection 94 of the lower stack holder 70. The reference electrode assembly 18 may be placed on top of the separator 16. The second surface 26 of the separator 22 of the reference electrode assembly 18 including the reference electrode 28 may be disposed toward the separator 16. The second tab 38-2 of the reference electrode assembly 18 including the reference electrode connector 42 may be disposed over the third current collector 76 in the first aperture 98-1 in the lower stack holder 70. Thus, the first tab 38-1 of the reference electrode assembly 18 including the negative electrode contact 30 may be disposed over the fourth current collector 78 in the second aperture 98-2. The negative electrode 12 may be placed on top of the reference electrode assembly 18 so that it contacts the negative electrode contact 30 on the first surface of the separator 22 of the reference electrode assembly 18.

The reference electrode 28 is placed over the third aperture 98-3 so that it is in electrical contact with the fifth current collector 80. The second conductive disc 130 is placed on top of the negative electrode 12. The second conductive disc 130 is in electrical contact with a first or back side 360 of the negative electrode 12 (first negative electrode side) and the negative electrode contact 30 is in electrical contact with a second or front side 362 of the negative electrode 12 (second negative electrode side). Thus, the device 50 can advantageously sense both the back-side 360 and front-side 362 negative electrode 12 voltages.

The internal assembly 56 is placed on top of the lower current collector assembly 58 to enclose the electrode stack 10 within the electrode stack chamber 326. The internal assembly 56 may be properly aligned with the lower current collector assembly 58 about the device axis 59 by disposing the axial pin 84 within the aperture 146 of the upper stack holder 68. The upper current collector assembly 54 may be assembled to the internal assembly 56. The first current collector 72 may be placed within the cap centrally-disposed opening 168 of the spring-retaining cap 128 and the upper centrally-disposed opening 139 of the upper stack holder 68. Proper alignment of the first current collector 72 in the upper stack holder 68 may be facilitated by sliding the radial pin 182 of the upper current collector assembly 54 through the axial groove 176 of the spring-retaining cap 128 and into the pocket 143 of the upper stack holder 68.

The upper enclosure 62 may be assembled to the lower enclosure 64. The stem 200 of the first current collector 72 may be inserted into the central axial opening 308 in the upper enclosure 62. The upper enclosure 62 can be twisted to engage the threads 320 of the upper enclosure 62 with the threads 233 of the base 216. The hermetically-sealed inner chamber 66 is formed by the cavities 234, 302 in the upper enclosure 62 and the base 216, respectively.

The potential of the center-mounted reference electrode 28 may be set prior to beginning electrochemical analysis. To accomplish this, after assembling the device the electrochemical cell is connected to an external circuit including a galvanostat. The circuit may be configured to make the reference electrode 28 a working electrode, the positive electrode 14 a counter electrode, and the auxiliary electrode 330 a reference electrode. The reference electrode 28 may be charged at low current until x is within the desired range (e.g., x=0.5) while monitoring its potential as compared to the auxiliary electrode 330. After the reference electrode 28 has been allowed to equilibrate at open circuit, its potential is again noted as compared to the auxiliary electrode 330. By way of non-limiting example, a typical potential may be about 3.420 V. The electrochemical cell connections are then reconfigured for electrochemical analysis such that the positive electrode 14 and the negative electrode 12 are either working or counter electrodes, the center-mounted reference electrode 28 is the reference electrode, and the auxiliary electrode 330 is disconnected electrode 330 is disconnected from the circuit of the electrochemical cell. The potentials of the working and counter electrodes may then be measured relative to the fixed reference electrode 28 potential, which has been established with respect to the auxiliary electrode 330 potential.

By way of non-limiting example, the value of the auxiliary electrode 330 equilibrium may be set to 0.0 V. All measured working and counter electrode potentials may be set relative to the potential of the auxiliary electrode 330. This may be accomplished by adding the reference electrode 28 potential to the measured potentials of the positive electrode 14 and the negative electrode 12. During the subsequent life of the cell, the potential of the reference electrode 28 may periodically be checked against the auxiliary electrode 330, and it can be recharged again if the potential is found to have drifted.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A device for performing electrochemical analysis of electrochemical cells, the device comprising:
a housing comprising a first non-electrically-conductive material and having an inner chamber configured to be hermetically sealed and a central axis extending therethrough;
a first current collector that is at least partially disposed within the inner chamber and comprising a first electrically-conductive material, the first current collector including a first cylindrical body extending along the central axis and configured to be in electrical contact with a first side of a negative electrode and an external circuit;
an upper stack holder disposed within the inner chamber and having an upper annular body comprising a second non-electrically-conductive material and including an upper centrally-disposed opening having the central axis extending therethrough, the upper annular body of the upper stack holder being disposed around at least a portion of a peripheral surface of the first cylindrical body of the first current collector; and
a lower stack holder disposed within the inner chamber and having a lower annular body comprising a third non-electrically-conductive material and including a lower centrally-disposed opening having the central axis extending therethrough, the lower stack holder defining a first stack aperture extending substantially parallel to the central axis, wherein the lower centrally-disposed opening of the lower stack holder cooperates with the upper centrally-disposed opening of the upper stack holder to define an electrode stack chamber configured to house the negative electrode, a positive electrode, and a center-mounted reference electrode;
a second current collector that is at least partially disposed within the lower centrally-disposed opening of the lower stack holder and comprising a second electrically-conductive material, the second current collector including a second cylindrical body extending along the central axis and configured to be in electrical contact with the positive electrode and the external circuit; and
a third current collector comprising a third electrically-conductive material, the third current collector having a third cylindrical body at least partially disposed in the first stack aperture and configured to be in electrical contact with the center-mounted reference electrode and the external circuit.

2. The device of claim 1, further comprising:
a fourth current collector comprising a fourth electrically-conductive material and having a fourth cylindrical body at least partially disposed in a second stack aperture of the lower annular body of the lower stack holder, the second stack aperture extending substantially parallel to the central axis, wherein the fourth current collector is configured to be in electrical contact with a second side of the negative electrode opposite the first side of the negative electrode and the external circuit; and
a fifth current collector comprising a fifth electrically-conductive material and having a fifth cylindrical body at least partially disposed in a third stack aperture of the lower annular body of the lower stack holder, the third stack aperture extending substantially parallel to the central axis, wherein the fifth current collector is configured to be in electrical contact with an auxiliary electrode disposed adjacent to the third stack aperture and between the upper stack holder and the lower stack holder.

3. The device of claim 2, further comprising:
a plurality of pins comprising a first pin, a second pin, and a third pin, each of the first pin, the second pin, and the third pin including a head and a shaft; and
a plurality of compression springs comprising a first compression spring, a second compression spring, and a third compression spring, wherein:
the upper annular body of the upper stack holder includes a first upper stack surface and a second upper stack surface opposite the first upper stack surface and defines a plurality of counterbores extending between the first upper stack surface and the second upper stack surface and substantially parallel to the central axis, the plurality of counterbores comprising a first counterbore, a second counterbore, and a third counterbore that are axially-aligned with the first stack aperture, the second stack aperture, and the third stack aperture, respectively;
the first pin, the second pin, and the third pin are at least partially disposed in the first counterbore, the second counterbore, and the third counterbore, respectively;
the shaft of the first pin is configured to engage the third current collector, the shaft of the second pin is configured to engage the fourth current collector, and the shaft of the third pin is configured to engage the fifth current collector; and
the plurality of compression springs engage the respective heads of the plurality of pins to maintain engagement of the first pin, the second pin, and the third pin with the third current collector, the fourth current collector, and the fifth current collector, respectively.

4. The device of claim 3, further comprising a spring-retaining cap comprising a cap annular body and engaging the first upper stack surface to retain the first compression spring, the second compression spring, and the third compression spring in the first counterbore, the second counterbore, and the third counterbore, respectively.

5. The device of claim 4, wherein the spring-retaining cap comprises a fourth non-conductive material.

6. The device of claim 2, wherein:
the lower annular body of the lower stack holder includes a first lower stack surface that engages the upper stack holder, a second lower stack surface opposite the first lower stack surface, and an annular projection extending from the first lower stack surface and disposed adjacent to the lower centrally-disposed opening of the lower stack holder; and
the first stack aperture, the second stack aperture, and the third stack aperture are each disposed radially outward of the annular projection.

7. The device of claim 6, wherein:
the second cylindrical body of the second current collector includes a stage that is at least partially disposed within the lower centrally-disposed opening of the lower stack holder and a flange projecting radially-outward from the stage, the second cylindrical body including a first body surface configured to engage the positive electrode and a second body surface opposite the first body surface;
the second current collector further includes a stem extending from the second body surface and substantially aligned with the central axis, the stem being at least partially disposed outside of the inner chamber for connecting to the external circuit;

the flange defines a first flange aperture substantially axially-aligned with the first stack aperture of the lower stack holder, a second flange aperture substantially axially-aligned with the second stack aperture of the lower stack holder, and a third flange aperture substantially axially-aligned with the third stack aperture of the lower stack holder; and the third current collector is at least partially disposed in the first flange aperture, the fourth current collector is at least partially disposed in the second flange aperture, and the fifth current collector is at least partially disposed in the third flange aperture.

8. The device of claim 7, further comprising an axial pin, wherein:

the upper annular body of the upper stack holder includes a first upper stack surface and a second upper stack surface opposite the first upper stack surface and engaging the first lower stack surface, the second upper stack surface defining a blind hole;

the lower stack holder further defines a fourth stack aperture disposed radially-outward of the annular projection and extending substantially parallel to the central axis;

the flange of the second current collector further defines a fourth flange aperture that is substantially axially-aligned with the fourth stack aperture; and the axial pin extends through the fourth flange aperture, the fourth stack aperture, and the blind hole.

9. The device of claim 2, wherein the fourth electrically-conductive material and the fifth electrically-conductive material comprise copper.

10. The device of claim 2, wherein:

the third current collector comprises a first wire partially disposed outside of the inner chamber for connection to the external circuit;

the fourth current collector comprises a second wire partially disposed outside of the inner chamber for connection to the external circuit; and the fifth current collector comprises a third wire partially disposed outside of the inner chamber for connection to the external circuit.

11. The device of claim 1, further comprising a central compression spring, wherein:

the first cylindrical body of the first current collector includes a first surface and a second surface opposite the first surface, the first surface defining a cylindrical depression centered with respect to the central axis and the second surface being configured to engage the first side of the negative electrode;

the first current collector further comprises a stem extending from a depression surface of the cylindrical depression, the stem being at least partially disposed outside of the inner chamber for connection to the external circuit; and the central compression spring being disposed around the stem and being configured to compress and engage the housing and the first current collector to maintain engagement of first current collector with the negative electrode.

12. The device of claim 1, further comprising a radial pin, wherein the radial pin is at least partially disposed in a blind hole defined in a peripheral surface of the first cylindrical body of the first current collector, the radial pin extending radially outward from the peripheral surface of the first cylindrical body and being configured to engage the upper stack holder to prevent rotation of the first current collector with respect to the upper stack holder.

13. The device of claim 1, further comprising:

a first conductive disc comprising the second electrically-conductive material and configured to be disposed between and electrically connected to the positive electrode and the second current collector, the first conductive disc being at least partially disposed within the lower centrally-disposed opening; and a second conductive disc comprising the first electrically-conductive material and configured to be disposed between and electrically connected to the first current collector and the negative electrode, the second conductive disc being at least partially disposed within the upper centrally-disposed opening.

14. The device of claim 1, wherein the first electrically-conductive material comprises copper and the second electrically-conductive material comprises aluminum.

15. The device of claim 1, wherein the third electrically-conductive material comprises glassy carbon.

16. The device of claim 15, wherein the third current collector comprises a wire comprising the glassy carbon, the wire being at least partially disposed within a tube comprising brass.

17. The device of claim 1, wherein the first non-electrically-conductive material, the second non-electrically-conductive material, and the third non-electrically-conductive material comprise polyetheretherketone (PEEK).

18. The device of claim 1, wherein the housing comprises:

a base comprising a base cylindrical body defining a first cavity, the base cylindrical body comprising a first plurality of threads; and a cap comprising a cap cylindrical body defining a second cavity, the cap cylindrical body comprising a second plurality of threads, wherein the second plurality of threads engages the first plurality of threads to fix the cap to the base, and the first cavity and the second cavity cooperate to define the inner chamber of the housing.

19. A device for performing electrochemical analysis of electrochemical cells, the device comprising:

a housing comprising a non-electrically-conductive material and having an inner chamber configured to be hermetically sealed and a central axis extending therethrough;

a first current collector that is at least partially disposed within the inner chamber and comprising a first electrically-conductive material, the first current collector including a first cylindrical body extending along the central axis and being in electrical contact with a first negative electrode side of a negative electrode and an external circuit;

an upper stack holder disposed within the inner chamber and having an upper annular body comprising the non-electrically-conductive material and including an upper centrally-disposed opening having the central axis extending therethrough, the upper annular body of the upper stack holder being disposed around at least a portion of a peripheral surface of the first cylindrical body of the first current collector;

a lower stack holder disposed within the inner chamber and having a lower annular body comprising the non-electrically-conductive material and including a lower centrally-disposed opening having the central axis extending therethrough, the lower stack holder defining a plurality of stack apertures extending substantially parallel to the central axis, wherein the plurality of stack apertures includes a first stack aperture, a second stack aperture, and a third stack aperture, and the lower centrally-disposed opening of the lower stack holder cooperates with the upper centrally-disposed opening of the upper stack holder to define an electrode stack chamber;

a reference electrode assembly comprising:
- a separator having a first separator surfaces and a second separator surface opposite the first separator surface;
- a conductive negative electrode contact disposed on the first separator surface of the separator and configured to be electrically connected to a second negative electrode side of the negative electrode opposite the first negative electrode side, the conductive negative electrode contact engaging the lower stack holder and extending over an end of the second stack aperture;
- a reference electrode disposed on the second separator surface, the reference electrode being centered with respect to the central axis; and
- a reference electrode connector disposed on the second separator surface and being electrically connected to the reference electrode, the reference electrode connector engaging the lower stack holder and extending over an end of the third stack aperture, wherein reference electrode assembly is configured to be disposed between the negative electrode and a positive electrode within the electrode stack chamber;

an auxiliary electrode disposed between the upper stack holder and the lower stack holder, extending over the stack third aperture, and disposed radially outward of reference electrode assembly;

a second current collector that is at least partially disposed within the lower centrally-disposed opening of the lower stack holder and comprising a second electrically-conductive material, the second current collector including a second cylindrical body extending along the central axis and being configured to be in electrical contact with the positive electrode and the external circuit;

a third current collector comprising a third electrically-conductive material, the third current collector having a third cylindrical body at least partially disposed in the first stack aperture and being in electrical contact with the reference electrode and the external circuit;

a fourth current collector comprising a fourth electrically-conductive material and having a fourth cylindrical body at least partially disposed in the second stack aperture, the fourth current collector being configured to be in electrical contact with the second negative electrode side and the external circuit; and a fifth current collector comprising a fifth electrically-conductive material and having a fifth cylindrical body at least partially disposed in the third stack aperture, the fifth current collector being in electrical contact with the auxiliary electrode and the external circuit.

20. The device of claim 19, further comprising:
a plurality of pins comprising a first pin, a second pin, and a third pin, each of the first pin, the second pin, and the third pin including a head and a shaft; and
a plurality of compression springs comprising a first compression spring, a second compression spring, and a third compression spring, wherein:
the upper annular body of the upper stack holder includes a first upper stack surface and a second upper stack surface opposite the first upper stack surface and defines a plurality of counterbores extending between the first upper stack surface and the second upper stack surface and substantially parallel to the central axis, the plurality of counterbores comprising a first counterbore, a second counterbore, and a third counterbore that are axially-aligned with the first stack aperture, the second stack aperture, and the third stack aperture, respectively;
the first pin, the second pin, and the third pin are at least partially disposed in the first counterbore, the second counterbore, and the third counterbore, respectively;
the shaft of the first pin is configured to engage the third current collector, the shaft of the second pin is configured to engage the fourth current collector, and the shaft of the third pin is configured to engage the fifth current collector; and
the plurality of compression springs engage the respective heads of the plurality of pins to maintain engagement of the first pin, the second pin, and the third pin with the third current collector, the fourth current collector, and the fifth current collector, respectively.

* * * * *